(12) United States Patent
Hayashi

(10) Patent No.: US 6,842,727 B1
(45) Date of Patent: Jan. 11, 2005

(54) DEVICE AND METHOD FOR ANALYZING EMI NOISE AND SEMICONDUCTOR DEVICE

(75) Inventor: Sachio Hayashi, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/453,966

(22) Filed: Dec. 3, 1999

(30) Foreign Application Priority Data

Dec. 4, 1998 (JP) .......................................... P10-345926

(51) Int. Cl.[7] .............................................. G06F 17/50
(52) U.S. Cl. ............................... 703/18; 703/16; 716/5; 345/440
(58) Field of Search ................................ 703/2, 14, 16, 703/18; 716/5, 2, 4; 345/440; 327/158, 581

(56) References Cited

U.S. PATENT DOCUMENTS

| | | | | |
|---|---|---|---|---|
| 5,404,310 A | | 4/1995 | Mitsuhashi | .................. 364/490 |
| 5,598,348 A | * | 1/1997 | Rusu et al. | .................. 364/491 |
| 5,652,716 A | * | 7/1997 | Battersby | ..................... 364/578 |
| 5,663,890 A | * | 9/1997 | Saleh et al. | .................. 364/490 |
| 5,663,892 A | * | 9/1997 | Hayashi et al. | .............. 364/491 |
| 5,878,053 A | * | 3/1999 | Koh et al. | ................... 371/22.1 |
| 5,963,023 A | * | 10/1999 | Herrell et al. | ................ 323/365 |
| 6,028,440 A | * | 2/2000 | Roethig et al. | .............. 324/765 |
| 6,499,129 B1 | * | 12/2002 | Srinivasan et al. | ............ 716/4 |

\* cited by examiner

*Primary Examiner*—Thai Phan
(74) *Attorney, Agent, or Firm*—Foley & Lardner LLP

(57) ABSTRACT

A technique for effectively attenuating EMI noise, which is generated from the electric power system of semiconductor devices, is described. In accordance with the technique, a power supply netlist with an additional electric current source(s) is generated by adding block power supply current waveform data, as extracted from test vector data and a block netlist, to the power supply netlist as extracted from the layout data of the circuit under analysis. A circuit simulation of the power supply netlist with an additional electric current source(s) is then performed in order to calculate power supply current/voltage waveform data. Furthermore, current/voltage spectral data is calculated by the Fourier transformation of the power supply current/voltage waveform data followed by displaying the current/voltage spectral data as the result of the Fourier transformation.

19 Claims, 20 Drawing Sheets

100MHz

DEVICE AND METHOD FOR ANALYZING EMI NOISE AND SEMICONDUCTOR DEVICE

BACKGROUND OF THE INVENTION

1. Field of the Invention

The present invention is related to a technique for suppressing noise as emitted from semiconductor devices such as integrated circuits, for example, a technique for suppressing EMI noise as emitted from the power supply system of the semiconductor device, noise as originating from the resonance between circuit elements contained in the semiconductor device, and so forth.

2. Description of the Related Art

Recently, emission of EMI noise becomes substantially problematic while the packing densities of integrated circuits have been increased. The EMI noise is thought to be generated in accordance with the mechanism as described in the followings. When a number of circuit elements are turned off/on at the same time within an integrated circuit, instantaneous currents are passed through a power source line. This rapidly changing electric current contains a number of high frequency components. Because of this, the wirings formed within the integrated circuit and the wirings outside of the integrated circuit can function as antennas, from which the high frequency components of said electric current are radiated as electromagnetic waves, i.e., EMI noise.

In order to attenuate EMI noise, capacitors and/or resistors have been inserted into suitable locations of the power system in the prior art technique. Also, the power system has been designed with a plurality of electric power supply systems for the same purpose. However, in the case of the prior art technique, the noise level can be evaluated only by actually fabricating the integrated circuit and measuring the electric current as output from the terminals of the integrated circuit. Accordingly, in order to attenuate the noise level by the prior art technique, actual measurement has to be repeated with a number of variations of the locations and the values of the capacitors and the resistors as inserted.

The reduction of EMI noise can be predicted in advance of manufacturing semiconductor chips if the spectral components of the electric current as generated associated with the operation of the integrated circuit can be analyzed on the basis of the design date. Furthermore, the locations and the values of the capacitors and the resistors as inserted can be optimized in advance of manufacturing semiconductor chips if it is possible to analyze the current flows and the spectral components of the electric current at the respective nodes inside of the integrated circuit in addition to the spectral components of the electric current at the pads of the integrated circuit. It is, however, difficult to analyze the current flows and the spectral components of the electric current at the respective nodes inside of the integrated circuit since the information about the current flows is not available by means of actual measurement.

A simulation system and a method for the semiconductor integrated circuits have been proposed in Japanese Patent Published Application No. Hei 9-55433 as a prior art technique for analyzing the power system of such an integrated circuit by the use of the result of automatic layout. In accordance with the simulation system and method, the voltage drop of the power lines and the ground lines within a circuit can be automatically obtained. Furthermore, an analyzing system and a method for analyzing the power networks of very large-scale integrated circuits have been proposed in Japanese Patent Published Application No. Hei 9-55433 by compacting functional regions of the layout of a semiconductor integrated circuit into compaction component values and simulating the power network on the basis of the compaction component values. In accordance with the simulation system and method, it is possible to conduct an effective analysis of the performance of the power network of a very large-seals integrated circuit. However, these conventional techniques are directed to the analysis of the voltage drop and the electromigration of the power system but not provided for the analysis of the spectral components of the electric currents and the current paths of power supply systems.

On the other hand another simulation method has been proposed in Japanese Patent Published Application NO. Hei 7-175838 in which circuit simulation is conducted by the use of a current source for representing the current/voltage waveforms of the digital circuits contained in a power supply netlist. However, the purpose of the conventional technique is to improve the accuracy of calculation of the noise level of an electric power source by calibrating the generation time of triangular waves. Namely, it is impossible to analyze the spectral components of the electric current in the power system, since the conventional technique is not directed to the measure to reduce EMI noise.

On the other hand, an integrated circuit can be recognized as an LC parallel resonant circuit equivalent thereto so that substantial noise is sometimes generated in the electric power supply system by the resonance in the circuit. The resonance in the circuit serves also to amplify EMI noise. As the measures for reducing noise associated with the electric power supply system, there are thought several methods, for example, by canceling our the resonant waves, reducing the Q of the resonance and so forth.

It in proposed in Japanese Patent Published Application NO. Hei10-23664 to cancel out the resonant waves by inserting an RLC serial resonant circuit in the integrated circuit. However, it is difficult to accurately determine the capacitance and the inductance of the LC circuit in accordance with the technique as proposed. For this reason, in order to determine the respective value of R, L and C to be inserted by the prior art technique, actual measurement nas to be repeated with a number of variations of the respective values, resulting in the problem that it takes much labor time and costs as required.

Furthermore, a resistor may be inserted to the electric power supply system in order to reduce the Q of the resonance. However, in this case, insertion of a large resistor possibly entails an undesirable power voltage drop. Because of this, in order to determine the resistance value of the resistor, actual measurement has to be repeated with a number of variations of the resistance values, resulting in the problem that it takes much lator time and costs as required.

SUMMARY OF THE INVENTION

It is an object of the present invention to provide a device and a method for analyzing EMI noise in accordance with which the reduction of EMI noise as generated from the electric power system of semiconductor device can be effectively conducted.

In order to accomplish the objects as described above, a method for analyzing EMI noise in accordance with the present invention comprising: a step of extracting a power supply netlist of a circuit under analysis from a layout data, a step of calculating the power supply current waveforms of respective blocks of said circuit by the use of a block netlist and test vector data; a step of generating a power supply netlist with an additional electric current source(s) by giving electric current sources having the power supply current waveforms of said respective blocks to said power supply netlist: a step of calculating a power supply current/voltage waveform data by performing a circuit simulation of said power supply netlist with an additional electric current source(s), a atop of calculating current/voltage spectral data by performing the Fourier transformation of the power supply current/voltage waveform data an calculated in the step of performing said circuit simulation; a step of displaying the current/voltage spectral data as obtained in the step of performing the Fourier transformation.

In accordance with the method for analyzing EMI noise, it is possible to analyze the power system current waveforms associated with the operation of the circuit by the circuit simulation and therefore to perform the evaluation of the noise level in advance of manufacturing the integrated circuit. Also, since the current paths can be visually confirmed with respect the power supply system in the integrated circuit, by display system serves to display the result of the circuit simulation. Accordingly, the locations and the values of the capacitors and the resistors to be added can be optimized in advance of manufacturing the integrated circuit. Furthermore, it is possible to analyze the power system voltage waveforms, and therefore to analyze the power voltage drop.

A preferred embodiment of the present Invention may include a step of outputting power supply current/voltage waveform data, if a single block is designated in block designation information, by calculating power supply current/voltage waveform data in the case that there exists only the electric current source as corresponding to the single block as designated, and calculating synthesized power supply current/voltage waveform data, if a plurality of blocks are designated in the block designation information, by summing up the power supply current/voltage waveform data calculated on the assumption that there exists only the electric current source alone as corresponding to each block as designated. In this case, for each of the plurality of the blocks as designated, a single electric current source having a power supply current waveform for said each of the plurality of the blocks as designated ls added to said power supply netlist in order to generate said power supply netlist with an additional electric current source(s) in the step of generating said power supply netlist with an additional electric current source(s). Also, for each of the plurality of the blocks as designated, power supply current/voltage waveform data in the case that a single electric current source having a power supply current waveform for said each of the plurality of the blocks as designated exists alone is calculated in the step of performing the circuit simulation by performing circuit simulation of said power supply netlist with additional electric current sources as generated in the step of power supply netlist with an additional electric current source(s). Furthermore, the current/voltage spectral data is calculated in the step of performing the Fourier transformation by performing the Fourier transformation of the power supply current/voltage waveform data as calculated in the step of calculating synthesized power supply current/voltage waveform data or by performing the Fourier transformation of the synthesized power supply current/voltage waveform date as calculated in the step of calculating synthesized power supply current/voltage waveform data. In accordance with this embodiment, user can visually confirmed the current paths and the electric current spectra in the case that there exists only the electric current source(s) an corresponding to the block(s) as designated in advance. Because of this, it is possible to elaborately provide the measure to reduce noise.

Another preferred embodiment of the present invention may include a step of a stop of generating a circuit element value modified power supply netlist by modifying the characteristic values of circuit elements contained in said power supply netlist with an additional electric current source(s) in accordance with circuit element value modification information as designated in advance. In accordance with this embodiment, a user can easily conduct the analysis with different characteristic values as modified of the circuit elements so that it is possible to effectively evaluate the measures to cope with noise.

In order to accomplish the objects as described above, a device for analyzing EMI noise in accordance with the present invention comprising, a power supply netlist extracting circuit for extracting a power supply netlist of a circuit under analysis from a layout date a block power supply current waveform analyzing circuit for calculating the power supply current waveforms of each of the respective blocks of said circuit from a block netlist and test vector data; on electric current source adding circuit for generating a power supply netlist with an additional electric current source(s) by adding an electric current source having a power supply current waveform for each of said respective blocks to the power supply netlist as extracted by said power supply netlist extracting circuit; a circuit simulation circuit for calculating power supply current/voltage waveform data by performing the circuit simulation or said power supply netlist with an additional electric current source(s); a Fourier transformation circuit for calculating current/voltage spectral data by performing the Fourier transformation of the power supply current/voltage waveform data as calculated by said circuit simulation circuit and a display system for displaying the current/voltage spectral data as calculated by said Fourier transformation circuit in accordance with the spectral intensity thereof.

In accordance with the device for analyzing EMI noise, it is possible to analyze the power system current waveforms associated with the operation of the circuit by the circuit simulation and therefore to perform the evaluation of the noise level in advance of manufacturing the integrated circuit. Also, since the current paths can be visually confirmed with respect the power supply system in the integrated circuit, by display system serves to display the result of the circuit simulation. Accordingly, the locations and the values of the capacitors and the resistors to be added can be optimized in advance of manufacturing the integrated circuit. Furthermore, it is possible to analyze the power system voltage waveforms, and therefore to analyze the power voltage drop.

A preferred embodiment of the present invention may include a power supply current/voltage waveform data synthesizing circuit for outputting synthesizing power supply current/voltage waveform data, if a single block is designated in block designation information, by calculating power supply current/voltage waveform data in the came that there exists only the electric current source as corresponding to the single block as designated, and calculating synthesized power supply current/voltage waveform data, if a plurality of blocks are designated in the block designation information, by summing up the power supply current/voltage waveform data calculated on the assumption that there exists only the electric current source alone as corresponding to each block so designated.

In this case, the power supply current/voltage waveform data synthesizing circuit serves to generate for each of the plurality of the blocks as designated, a single electric current source having a power supply current waveform for said each of the plurality of the blocks as designated is added to said power supply netlist in order to generate said power supply netlist with an additional electric current source(s). Also, the circuit simulation circuit calculates for each of the plurality of the blocks an designated, power supply current/voltage waveform data in the case that a single electric current source having a power supply current waveform for said each of the plurality of the blocks as designated exists alone is calculated by performing circuit simulation of said power supply netlist with additional electric current sources as generated by said electric current source adding circuit. Furthermore, Fourier transformation circuit calculate the current/voltage spectral data by performing the Fourier transformation of the power supply current/voltage waveform data as calculated by said power supply current/voltage waveform date synthesizing circuit or by performing the Fourier transformation of the synthesized power supply current/voltage waveform data as calculated by power supply current/voltage waveform data synthesizing circuit.

Also, a preferred example of the electric current source adding circuit serves to add as the electric current source for the respective blocks, current waveforms defined in a plurality of time periods each of which is given only the current waveform of each one of the respective blocks. In accordance with these embodiment, a user can visually confirmed the current paths and the electric current spectra in the case that there exists only the electric current source(s) as corresponding to the block(s) as designated in advance. Because of this, it is possible to elaborately provide the measure to reduce noise.

A preferred embodiment of the present invention way include a circuit element value modifying circuit for generating a circuit element value modified power supply netlist by modifying the characteristic values of circuit elements contained in maid power supply netlist with an additional electric current source(s) in accordance with circuit element value modification information as designated in advance. In accordance with this embodiment, it is possible to easily conduct the analysis with different characteristic values as modified of the circuit elements and therefore to effectively evaluate the measures to cope with noise.

In accordance with a preferred embodiment of the present invention, said blocks are defined by dividing the layout data with a grating to form predetermined unit areas. In accordance with this embodiment, it is possible to conduct the noise analysis also for integrated circuits such as ASICs, which have been not designed with distinctive blocks.

In accordance with another preferred embodiment of the present invention, said block power supply current waveform analyzing circuit comprises a logic simulation circuit for performing a logic simulation of the respective blocks, and a power supply current waveform synthesis circuit that sums up the power supply current waveforms of cells, each call being defined in the circuit, in accordance with the result of the said logic simulation. In accordance with this embodiment, it is possible to calculate the power supply current waveforms of the respective blocks. In accordance with a further preferred embodiment of the present invention, said display system serves to distinctively display the spectral intensity of the current/voltage spectral data on the layout data by colors, patterns and/or combinations thereof at the frequency an designated, in accordance with a further preferred embodiment of the present invention, said display system serves to distinctively display the directions of the electric currents with arrows on the layout data at the time as designated in advance, and to distinctively display the level of the electric current by the colors, lengths and/or widths of the arrows at the designated. In accordance with a further preferred embodiment of the present invention, said display system serves to display the current/voltage waveform data and the current/voltage spectral data in a location as designated in a graphic image. In accordance with a further preferred embodiment of the present invention, said display system serves to distinctively display an area including parallel lines through which electric currents flows in the same direction.

In accordance with a further preferred embodiment of the present invention, said display system serves to distinctively display an area including a loop along which electric currents flows with the product of the area of the loop and the current flowing along the loop which product is greater then a value as designated in advance. In accordance with these embodiment, the distribution of the electric currents within the integrated circuit can be displayed in such a manner as a user can easily understand. Because of this, when the locations and the values of the capacitors, it is possible to determine problematic locations and the resistors to be added and therefore to effectively conduct the measure to reduce noise.

It is another object or the present invention to provide a semiconductor device for which the reduction of noise originating from resonance within the semiconductor device can be effectively conducted.

In order to accomplish the objects as described above a semiconductor device in accordance with the present invention comprising, an electric characteristic value variable circuit provided with an inner circuit whose electric characteristic value can be modified: and a control circuit for said electric characteristic value variable circuit in accordance with a predetermined setting value as externally input in order to modify the electric characteristic value of said inner circuit.

In accordance with said semiconductor device, since the electric characteristic values of the integrated circuit are variable, it is possible to determine optimum characteristic values corresponding to minimum noise originating from the electric power source in advance massproduction or the integrated circuit.

In accordance with a preferred embodiment of the present invention, said electric characteristic value variable circuit includes at least one as selected among from a group comprising a variable capacitance element whose capacitance value is variable, an variable inductance element whose inductance value is variable and a variable resistance element whose resistance value in variable.

In accordance with another preferred embodiment of the present invention, said variable capacitance element is composed of a plurality of capacitors which are rendered effective selectively independent from each other. In accordance with a further preferred embodiment of the present invention, said variable inductance element is composed of a plurality of inductors which are rendered effective selectively independent from each other. In accordance with a further preferred embodiment of the present invention, said variable resistance element is composed of a plurality of resistors which are rendered affective selectively independent from each other. In accordance with these embodiment, the capacitance values and the inductance values in the integrated circuit can be modified so that it is possible to suppress the resonance or, the cause of noise to the minimum level.

A preferred embodiment of the present invention may include a noise detecting circuit for detecting noise as generated by said inner circuit, said control circuit serves to control said electric characteristic value variable circuit whose electric characteristic value can be modified on the basis of information about the noise as detected by said noise detecting circuit. In accordance with this embodiment, since the electric characteristic values of the circuit is controlled with reference to information about noise as detected from the integrated circuit, it is possible to automatically suppress the noise level.

The present disclosure relates to subject matter contained in Japanese Utility Model Application No. HEI10-345926, filed on Oct. 4, 1998, the disclosure of which is expressly incorporated herein by reference in its entirety.

DETAILED DESCRIPTION OF THE PREFERRED EMBODIMENTS

A method for analyzing EMI noise and an embodiment of the apparatus for analyzing EMI noise in accordance with the present invention will be explained as embodiments 1 to 3. Also, an embodiment of the semiconductor device in accordance with the present invention will be explained as an embodiment 4.

[EMBODIMENT 1]

Figure 1:
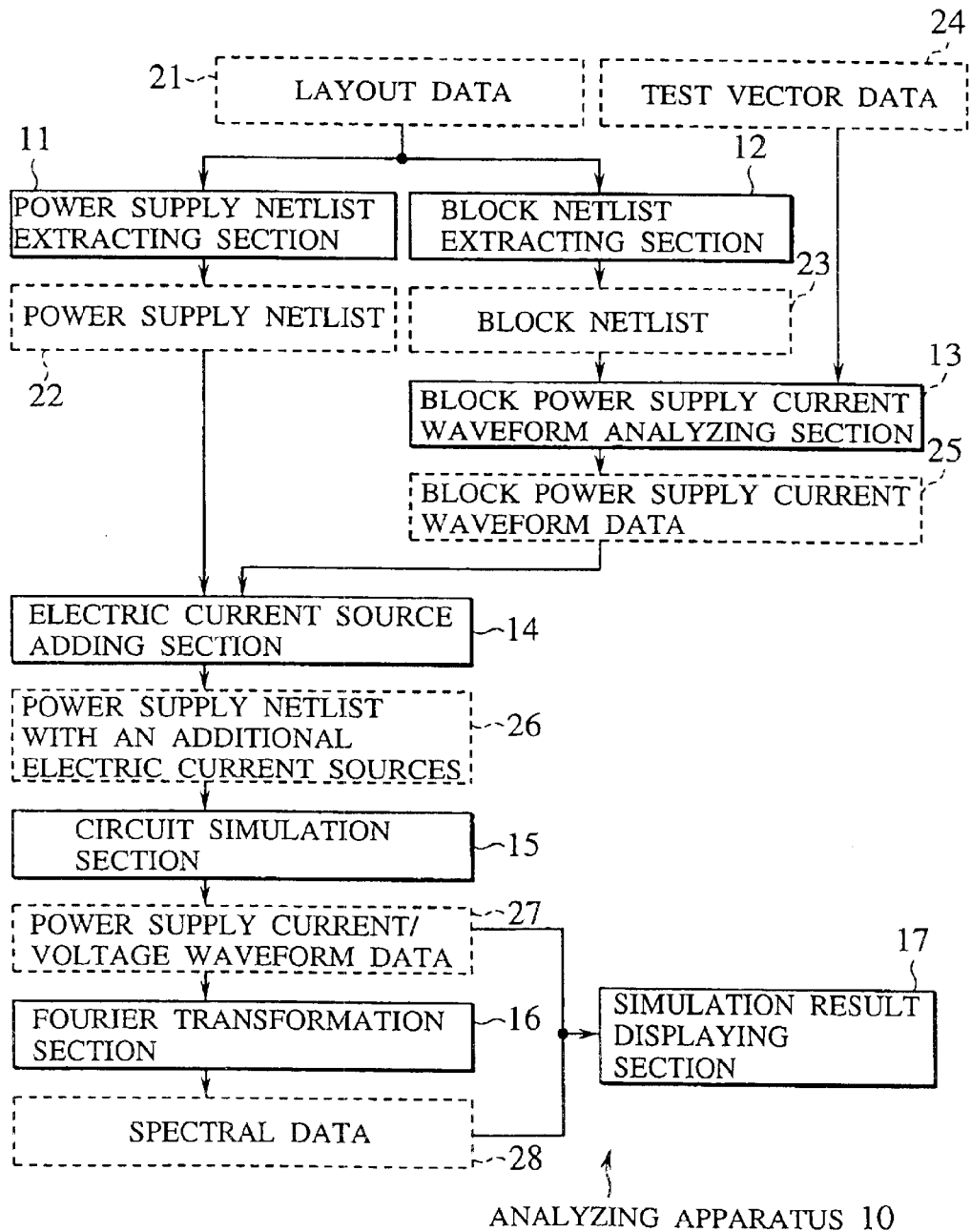
FIG. 1 is a block diagram showing the configuration of the noise analyzing apparatus in accordance with the embodiment 1 or the present invention.
Figure 2:
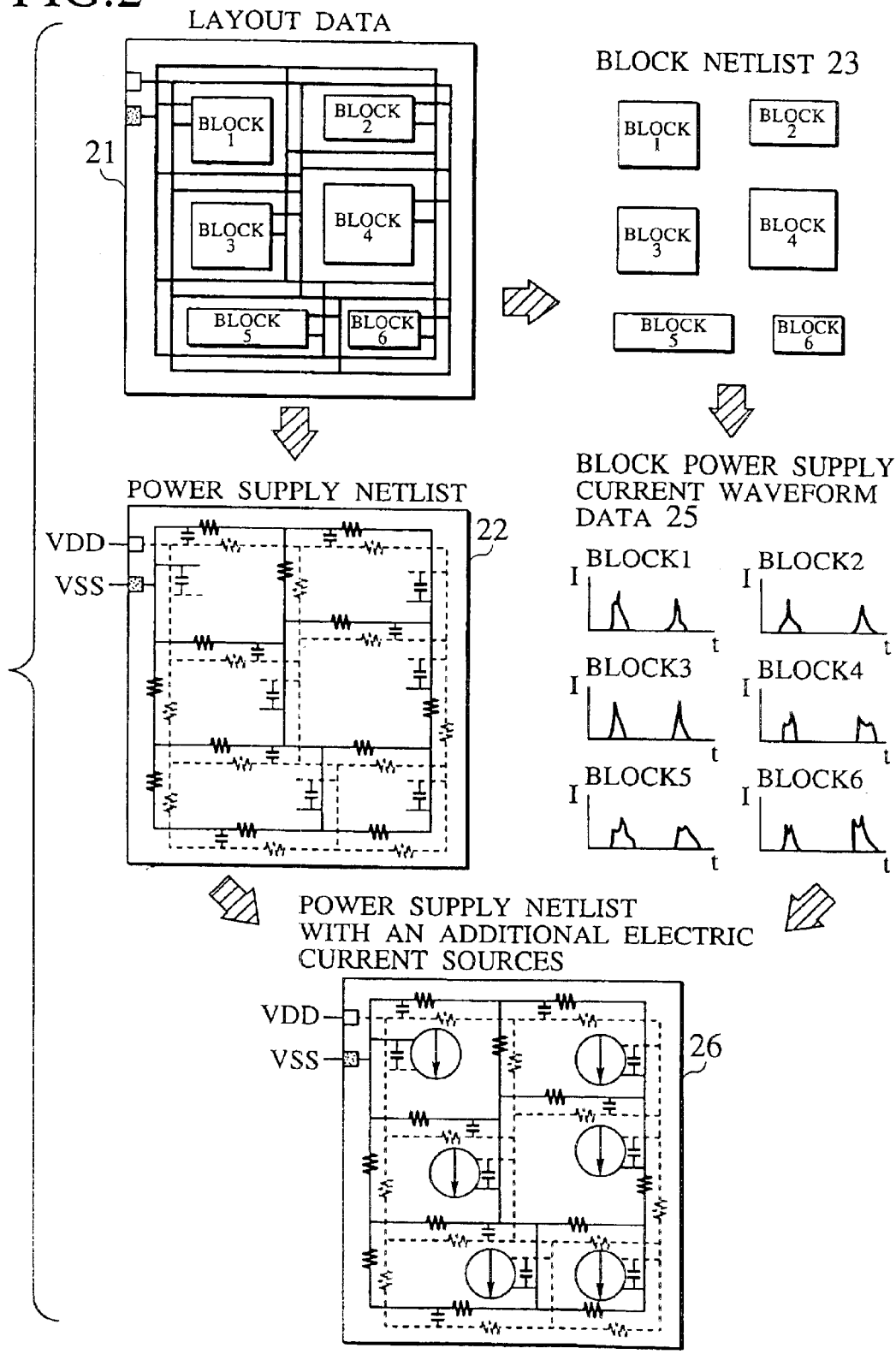
FIG. 2 is an explanatory view for explaining the process of preparing a power supply netlist with an additional electric current source(s) by the use of layout data.

FIG. 1 is a block diagram showing the apparatus for analyzing EMI noise in accordance with the embodiment 1 of the present invention. In FIG. 1 (as well as FIGS. 5, 14 and 16) enclosed in solid lines are functional blocks of the apparatus for analyzing EMI noise. On the other hand, data components and lists are included in broken lines by enclosing with broken lines. FIG. 2 is provided to illustrate the process of preparing a power supply netlist with an additional electric current source(s) by the use of layout data in the noise analyzing apparatus.

The noise analyzing apparatus 10 is composed of a power supply netlist extracting section 11, a block netlist extracting section 12, a block power supply current waveform analyzing section 13, an electric current source adding section 14, a circuit simulating section 15, a Fourier transformation section 16 and a simulation result displaying section 17. Meanwhile, layout data and test vector data as explained in the followings are supplied through an input device not shown in the figure.

Figure 3:
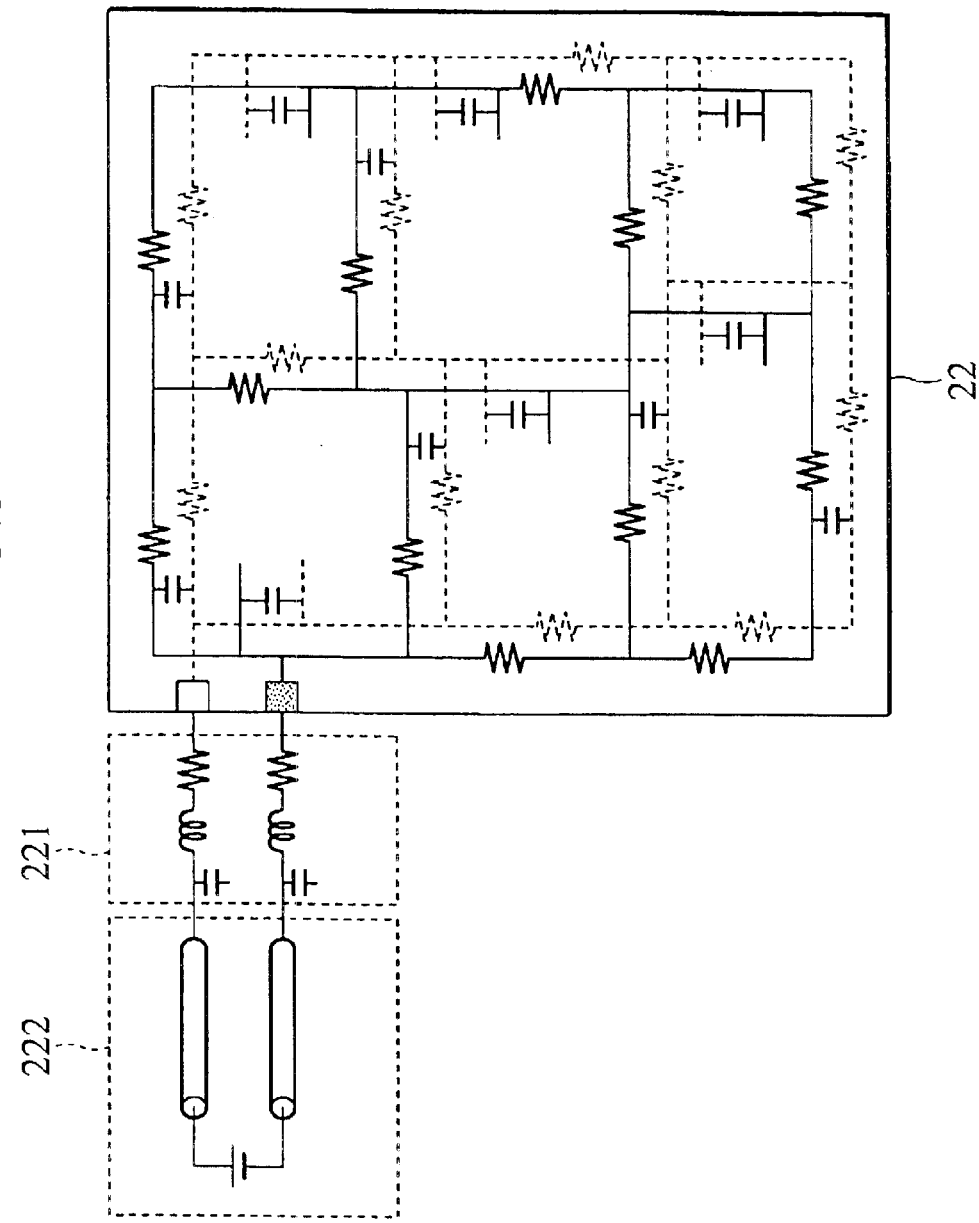
FIG. 3 is a circuit diagram showing an example of the case that an equivalent circuit of the package and an equivalent circuit of a printed circuit board are added to a power supply netlist.
Figure 4:
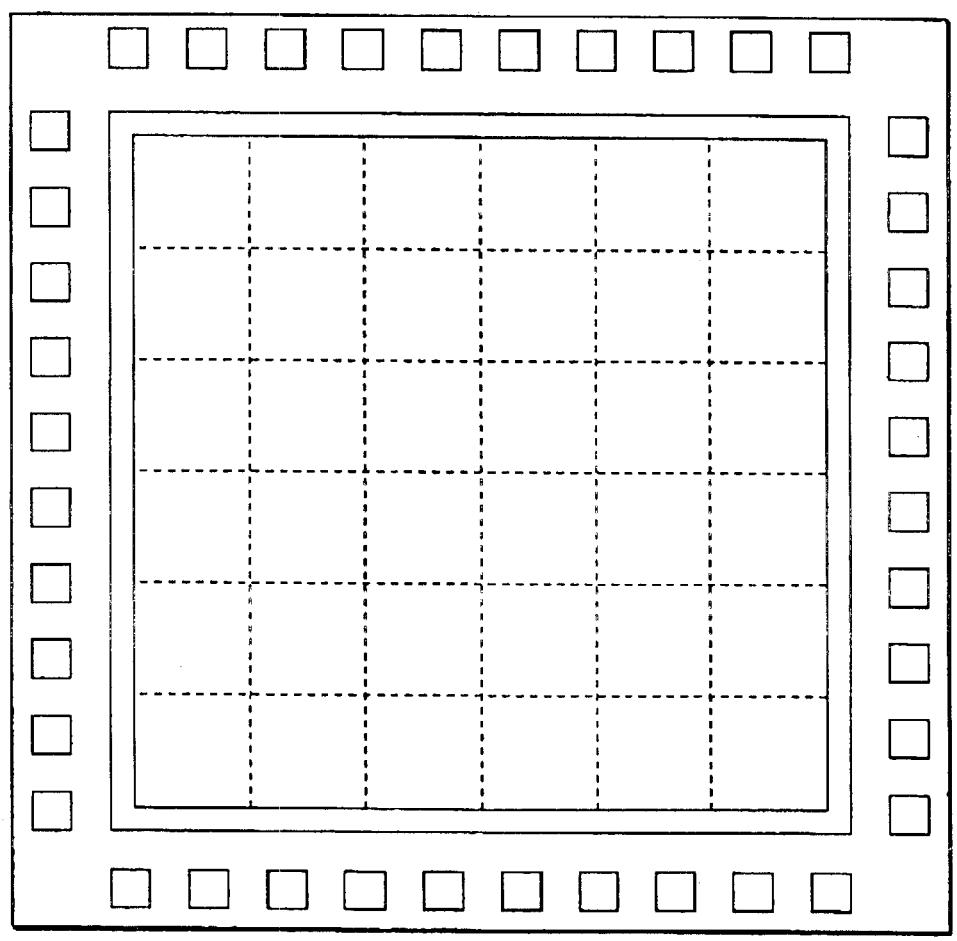
FIG. 4 is an explanatory view showing an example of the case that the layout data of an ASIC is divided by a grating into a number of blocks as defined FIG. 5 a block diagram showing an example of the block power supply current waveform analyzing section.

The power supply netlist extracting section 11 serves to receive the layout data 21 of an integrated circuit under analysis and extract a power supply netlist 22. The layout data 21 is design data representing the physical configuration of elements, such as transistors and resistors, and wirings for connecting these elements each other. The power supply netlist 23 os design data representing the connection relationship of the power supply system composed of the power supply lines and the ground lines provided for supplying electric power to the respective blocks in the LSI from the power terminals of the LSI. The power supply netlist 22 includes resistance elements, capacitance elements and inductance elements parasitically associated with the power lines and the ground lines, and also includes resistance elements, capacitance elements and inductance elements as intentionally inserted for the purpose of reducing noise. An equivalent circuit 221 of the package and an equivalent circuit 222 of the printed circuit board may be added to the power supply netlist 22 as illustrated in FIG. 3.

The data relating to the respective elements and the respective nodes in the power supply netlist 22 an extracted by the power supply netlist extracting section 11 is stored in a data storing section not shown in the figure with the location information in the layout data 21. The location information is used later to display the stimulation result on the layout data 21.

The block netlist extracting section 12 serves to receive the layout data 21 and extract the block netlist 23. In this case, the block netlist 23 is design date representing of the circuit connection within the respective blocks. If there has been available the data of the block nets when designing, this stop can be dispensed with, Meanwhile, in the case of some integrated circuits such as ASICS, the circuit layout is not designed with distinctive blocks. With respect to the integrated circuits of this kind, the entirety of a chip may be divided by a grating into a number of blocks having appropriate areas as defined for convenience. By this procedure, the noise analysis becomes possible for the integrated circuit such as ASICs.

The block power supply current waveform analyzing section 13 serves to receive the block netlist 23 and the test vector data 24 and calculate block power supply current waveform data 25 as the power supply current waveforms. In this case, the block power supply current waveform data 25 is the waveform data of the power supply current as consumed by the block circuits during the circuit operation of the respective blocks. Also, the test vector data 24 is input signal data given for the purpose of simulating the circuit operation of the respective blocks.

The block power supply current waveform analyzing section 13 may be implemented, for example, with a switching simulator capable of analyzing the power supply current waveforms. Alternatively, a circuit simulator such an a SPICE (Simulation Program with Integrated Circuit Emphasis) can be used for the same purpose. In the case of the SPICE, however, the maximum size of a block as processed is limited in view of the process time, the available memory and so forth. Thence, a switching simulator can be used for the same purpose. In the case of the switching simulator, while the accuracy of the simulation is inferior to that of a SPICE, a block composed of up to hundreds of transistors can be processed by a usual EWS.

Figure 5:
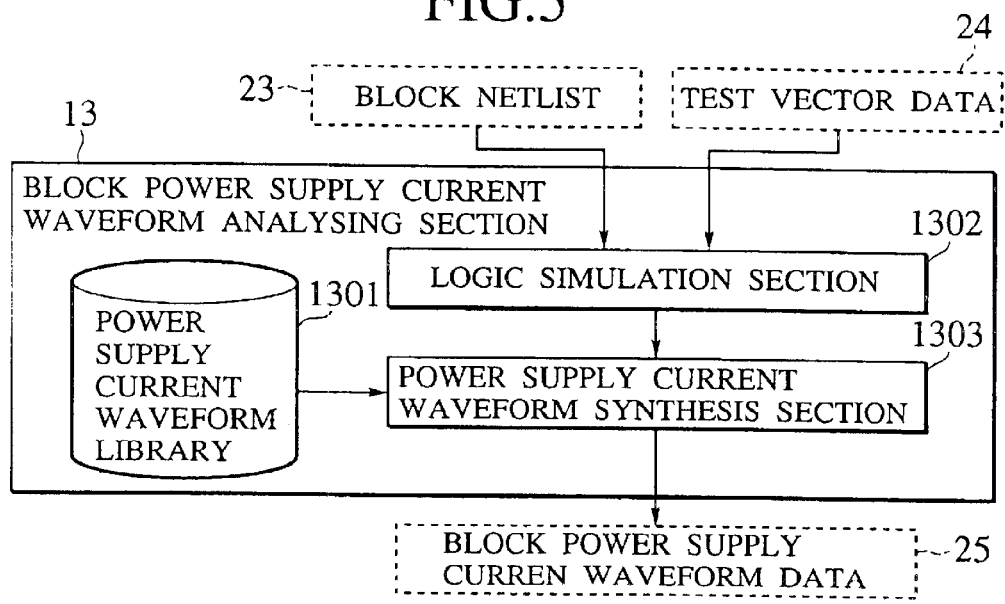

On the other hand, in the cave of an ASIC, the block power supply current waveform analyzing section 13 can be designated as illustrated in FIG. 5.

The operation of the block power supply current waveform analyzing section 13 as illustrated in FIG. 5 will be explained. First of all, the power supply current waveforms are analyzed for the respective cells of the ASIC, followed by storing the waveform data as a power supply current waveform library 1301. Next, a logic simulation is performed in a logic simulation section 1302 by the use of the block netlist 23 and the test vector data 24. The result of the logic simulation is used to obtain the switching times of the respective cells. Next, the power supply current waveforms of the cells stored in the power supply current waveform library 1301 are summed up by means of a power supply current waveform synthesis section 1303, in accordance with the result of the said logic simulation, at each time switching takes place in the cells. As a result, the block power supply current waveform date 25 can be obtained. By this configuration, the power supply current waveforms of the respective blocks can be quickly obtained.

The electric current source adding section 14 serves to add to each block of the power supply netlist 22 an electric current source corresponding to the block in order to generate the power supply netlist 26 with an additional electric current source(s). The block power supply current waveform data as obtained by the block power supply current waveform analyzing section 13 is given as data of the current waveforms of the electric current sources.

The circuit simulating section 15 serves to perform a circuit simulation of the power supply netlist 26 with an additional electric current source(s). The current waveform data of the respective elements and the voltage waveform data an obtained by the circuit simulation is then stored as the power supply current/voltage waveform data 27. When the number of elements and the number of nodes are large, however, only data of elements and nodes relating to representative points of the layout data 21 may be stored. The power supply current/voltage waveform data 27 includes the current waveform data and the voltage waveform data from which is obtained current data and voltage data respectively. The circuit simulation may be implemented, for example, with a circuit simulator such ae a SPICE.

Figure 6A:
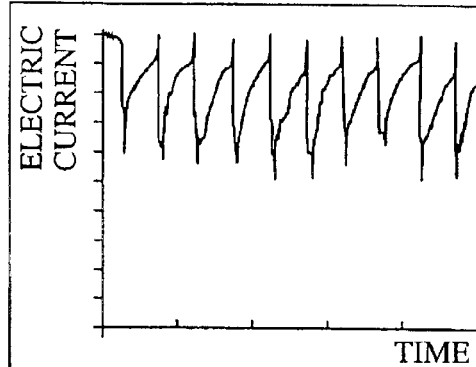
FIG. 6A is an explanatory view for explaining the current waveform data.
Figure 6B:
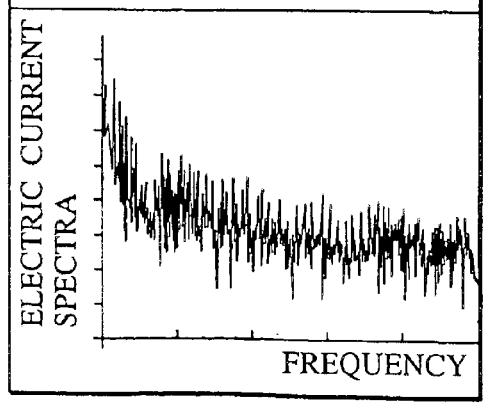
FIG. 6B is an explanatory view for explaining the electric current spectral data obtained from the Fourier transformation.

The Fourier transformation section 16 serves to calculate spectral data by performing the Fourier transformation of the power supply current/voltage waveform data 27 as obtained by the circuit simulation section 15. FIG. 6 shows the current waveform data contained in the power supply current/voltage waveform data 27 and the electric current spectral data as obtained by the Fourier transformation thereof in a graphic image. FIG. 6A shown the current waveform data while FIG. 6B shows the electric current spectral data as obtained by the Fourier transformation thereof. However, the ordinate and the abscissa represent the electric current and the time respectively. Also, in FIG. 6B, the ordinate and the abscissa represent the electric current spectra (the units used are decibels) and frequencies respectively.

Meanwhile, the spectral data 28 as calculated by the Fourier transformation includes the electric current spectral data and the voltage spectral data. Not shown in the figure, the voltage spectral data is obtained by performing the Fourier transformation of the voltage waveform data contained in the power supply current/voltage waveform data 27.

The simulation result displaying section 17 is a display system such as a CRT on which is displayed the power supply current/voltage waveform data 27 and the spectral data 28.

Figure 7:
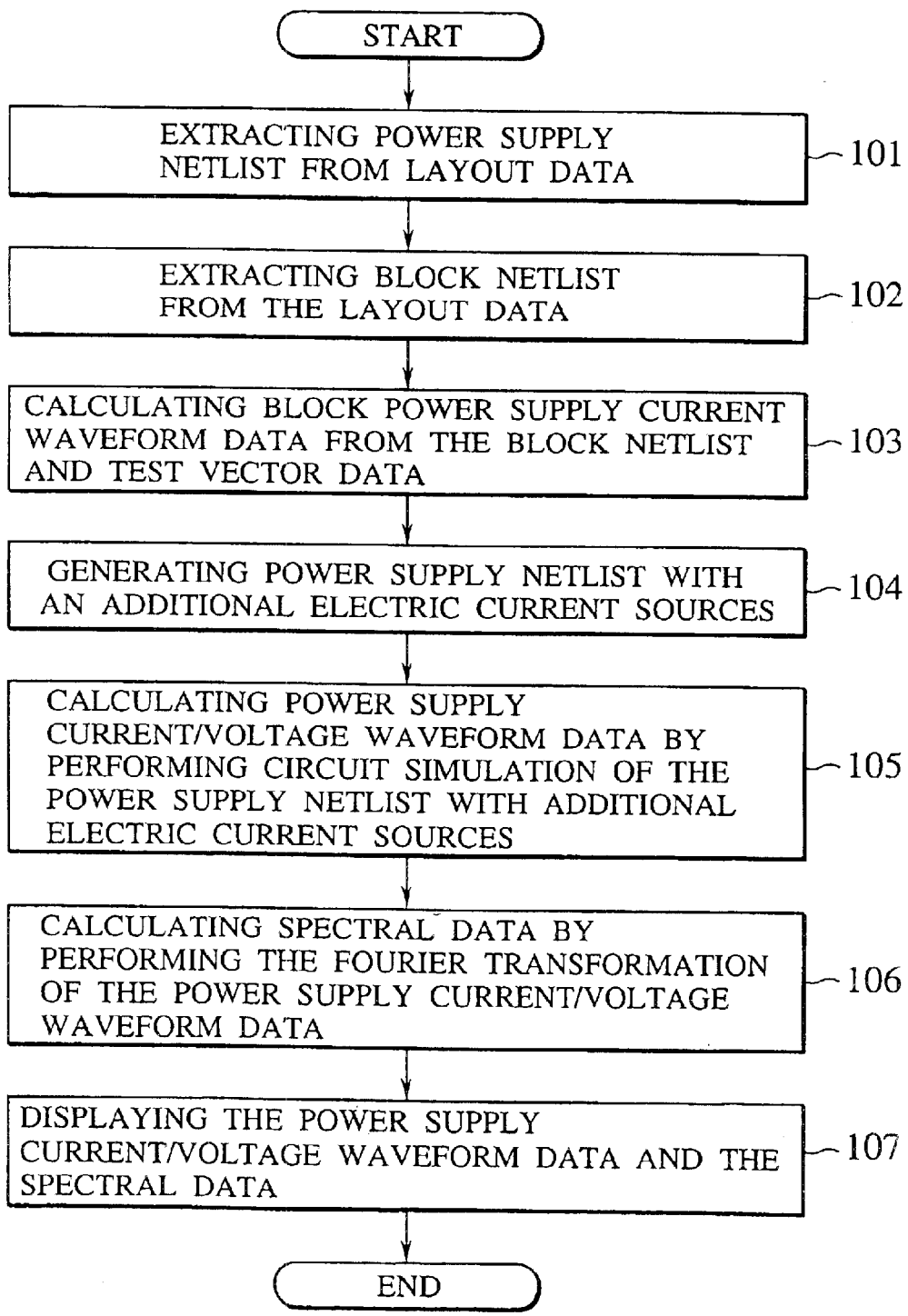
FIG. 7 is a flowchart showing the procedure for the noise analysis by means of the noise analyzing apparatus in accordance with the embodiment

The noise analyzing apparatus 10 as illustrated in FIG. 1 may be implemented within a usual computer system composed of a CPU for executing a variety of arithmetic operations, input devices such as a keyboard, a mouse, a light pen and the like, an external storage devices such as a memory device, a disk storage device and the like, and output devices such as a display system, a printer device and the like. The CPU is composed of an arithmetic logic unit for performing the respective steps of the flowchart as illustrated in FIG. 7 and a storage unit for storing instructions required for these steps.

Next, the procedure for the noise analysis by means of the noise analyzing apparatus 10 as described above will be explained in accordance with the flowchart ox illustrated in FIG. 7.

First of all, the power supply netlist 22 extracted by the power supply netlist extracting section 110D the basis of the layout data 21 of the integrated circuit under analysis (in the step 101). Next, the block netlist 23 to extracted by the block netlist extracting section 12 on the basis of the layout data 21 (in the step 102). The block power supply current waveform data 25 is then calculated by the block power supply current waveform analyzing section 13 on the basis of the block netlist 23 and the test vector data 24 (in the step 103). Next, the power supply netlist 26 with an additional electric current source(s) is generated by the electric current source adding section 14 by adding to the is respective blocks of the power supply netlist 22 electric current sources corresponding thereto (In the step 104). Furthermore, the circuit simulating section 15 performs the circuit simulation of the power supply netlist 26 with an additional electric current source(s) in order to calculate the power supply current/voltage waveform data 17 (in the stop 105). Next, the Fourier transformation section 16 performs the Fourier transformation of the power supply current/voltage waveform data 27 as calculated by the circuit simulation section 15 in order to calculate the spectral data 28 (in the step 106). The power supply current/voltage waveform data 27 and the spectral data 28 are displayed in the screen of the simulation result displaying section 17 (in the step 107).

Next, several examples of the display of the simulation result displaying section 17 will be explained in the case of showing the result of the analysis of the power supply current/voltage waveform data 27, the spectral data 28 and the result of the analysts thereof.

Figure 8:
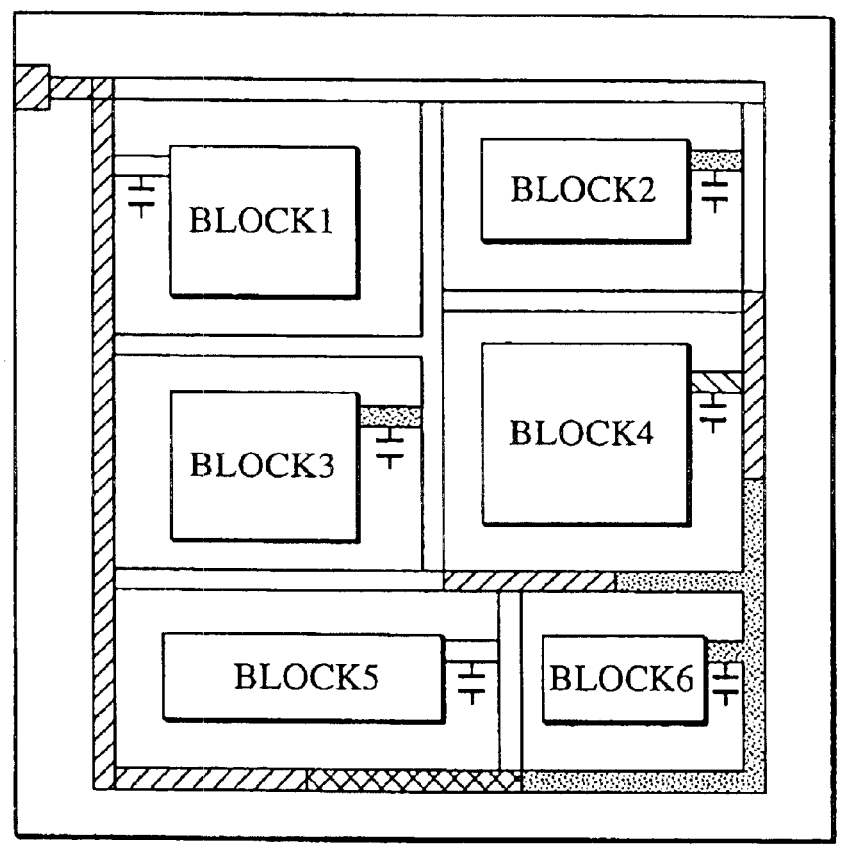
FIG. 8 is an explanatory view for explaining an exemplary display image of the electric current spectral data.

FIG. 8 ls a schematic diagram showing an exemplary display image of the electric current spectral data. When a user instructs a frequency, the noise analyzing apparatus 10 serves to overlap the spectral intensity at the frequency with the layout data 21 as illustrated in FIG. 8. The level of the spectral intensity ls distinctively shown with different colors or different patterns. In FIG. 8, darker shading in indicative of a higher spectral intensity. By this arrangement, a user can easily and visually understand the distribution of the high frequency components of the electric current only by designating a particular frequency.

More specifically speaking, a user can have the following information. Larger current components of noise are generated at 100 MHz from Block 2, Block 3 and Block 6 as illustrated in FIG. 8. While each of Block 2. Block 3 and block 6 is provided with a capacitance respectively, the current components of noise as generated from Block 2 and Block 3 is absorbed by the capacitance so that little noise leaks there from. The current components of noise as generated from Block 6, however, is hardly absorbed by the capacitance so that the noise an leaking there from reaches to the vicinity of terminals. The user can therefore recognize and consider the necessity of replacing the capacitance located in the vicinity of Block 6 by a lager capacitance or connecting another capacitance on the path of the noise.

Figure 9:
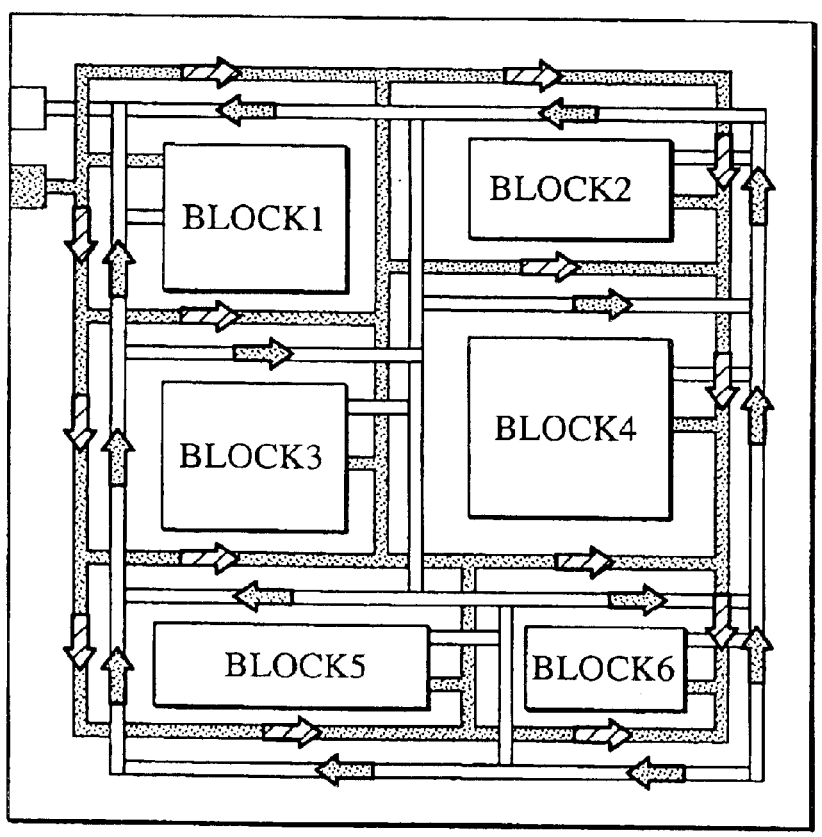
FIG. 9 is an explanatory view for explaining an exemplary display image of the current data obtained from the electric current spectral data.

FIG. 9 is a schematic diagram showing an exemplary display imago of the current data obtained from the electric current spectral data. When the time to elapse from the start in the simulation is instructed by a user, the noise analyzing apparatus 10 overlaps, with the layout data 21, the direction of the electric current and the level of the electric current at the time as instructed, i.e., t=10 ns in this case. The direction of the electric current can be indicated by arrows. The level of the electric current may be distinctively shown with arrows having different widths, different lengths, different colors and so forth. In this example, the level of the electric current is indicated by the width of arrows. By this arrangement, a user can easily understand, for example, the distribution of the current paths within the LSI at a falling or rising edge of a clock signal only by designating a particular time.

Said current waveform data is data included in the power supply current/voltage waveform data 27 calculated by the circuit simulation section 15. The current paths can be obtained also from the power supply current/voltage waveform data 27 in advance of the Fourier transformation as illustrated in FIG. 9. Namely, a user can have information about the rough outline of the causes of noise. Also in this case, the reduction of EMI noise can be effectively conducted as compared to the conventional technique of repeating actual measurement with a number of variations of the locations and the values of the capacitances and the resistors of the integrated circuit for the purpose of evaluating the effects of the measures to cope with noise.

Figure 10A:
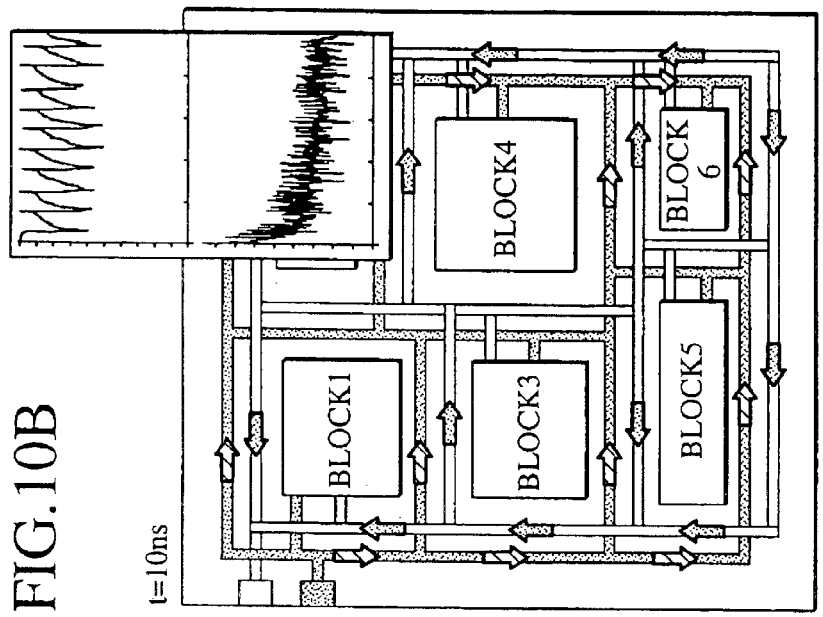
FIG. 10A is a schematic diagram showing the current waveform data and the electric current spectral data in the location as designated and popping up vis-a-vis on the layout data.
Figure 10B:
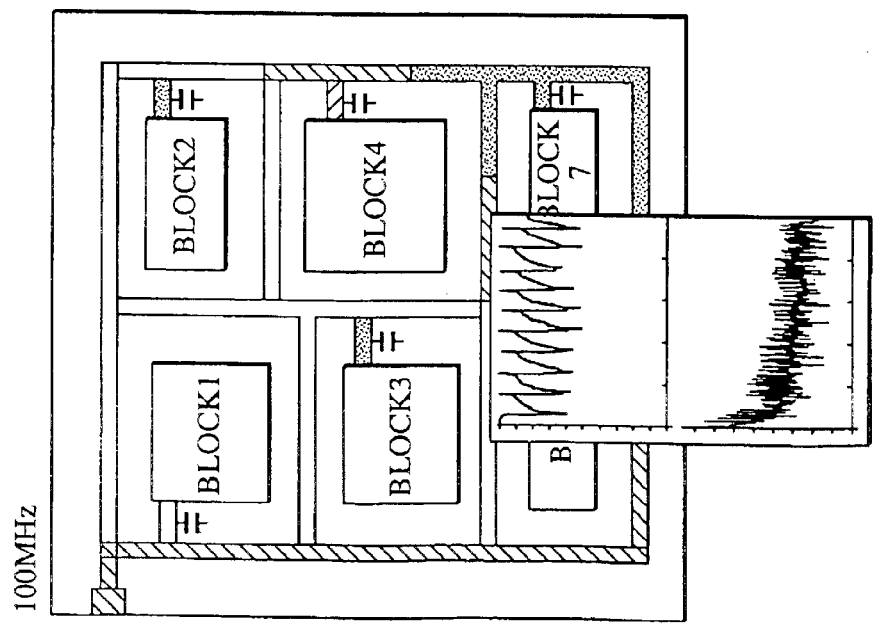
FIG. 10B is a schematic diagram showing the current waveform date no the electric current spectral data is the location as designated and popping up vis-a-vis on the layout date.

FIG. 10 is a schematic diagram showing another exemplary display image. Namely, when a user designates a particular location on the layout data, for example, by the use of a cursor, the current waveform data and the electric current spectral data corresponding to the location in the layout pops up vis-a-vis in the location of the cursor an illustrated in FIG. 10. FIG. 10A is a schematic diagram showing the current waveform data and the electric current spectral data; at 100 MHz in the location as designated and popping up vis-a-vis. FIG. 10B is a schematic diagram showing the current waveform data and the electric current spectral data at 100 MHz at a time t=ns in the location on the power source line as designated sad popping up vis-a-vis.

Figure 11:
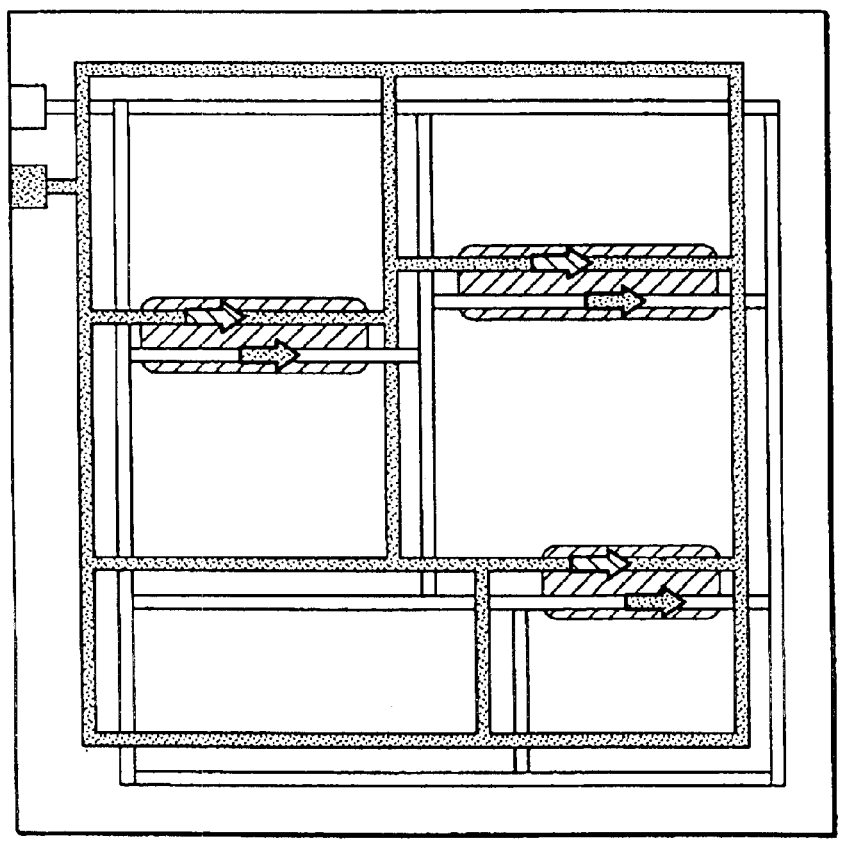
FIG. 11 is an explanatory view showing the status of electric currents being passed thorough parallel lines in the same direction within a circuit.
Figure 12:
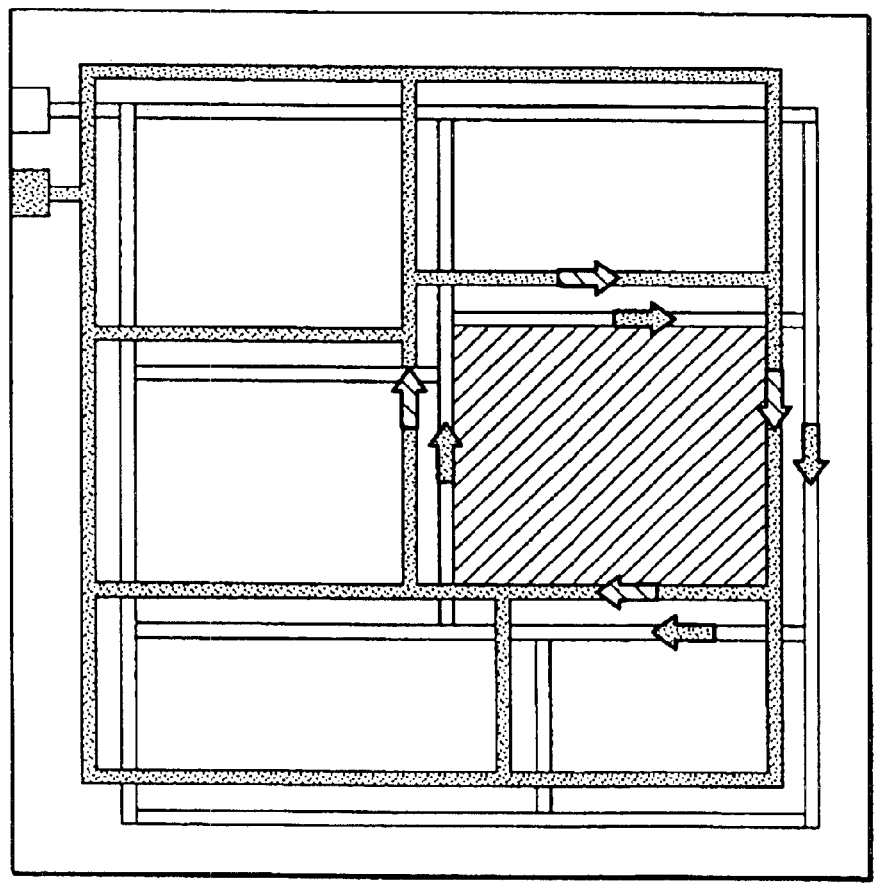
FIG. 12 is an explanatory view for explaining an exemplary display image of the voltage data.

FIGS. 11 and 12 are schematic diagram showing exemplary display images of the result of a further analysis on the basis of the current waveform data as explained above.

If electric currents are passed through parallel lines in the same direction within a circuit, the influence of the inductance tends to be enhanced resulting in the possibility of causing a problematic resonance. FIG. 11 shows an exemplary display image of a possibly problematic area, which is highlighted by a different color or a different pattern than the otter areas, by detecting, among from parallel lines, those lines through which electric currents flows in the same direction and identify the possibly problematic area as including those lines as detected. Namely, as shown in FIG. 11, it is to give the pattern (hatched with slant lines in this case) to the area including lines in which the electric current flowing in the same direction, and it is possible to specify the area with causes of a resonance.

Also, if there in a loop current in the circuit, it may function as a loop antenna from which electromagnetic waves are radiated. In this case, the magnitude of electromagnetic waves as radiated is proportional to the product of the area of the loop and the current flowing along the loop. FIG. 12 shows an exemplary display image of a possibly problematic area, which is highlighted by a different color or a different pattern than the other areas, by detecting such, an area including a loop along which electric currents flows with the product of the area of the loop and the current flowing along the loop and which product is greater than a value as designated. Namely, as shown in FIG. 12, it is to give the pattern thatched with slant lines in this case) to the part in which the current is flowing looped, and it is possible to specify the area with the possibility of radiating electromagnetic wave.

In the case or the noise analyzing apparatus 10 of the embodiment 1 as explained above, it is possible to analyze the power supply current waveforms associated with the operation of the integrated circuit under analysis and therefore to evaluate the noise level in advance of actually manufacturing the integrated circuit. Also, since the electric current spectra and the current paths can be visually confirmed with respect to each section of the power supply system in the integrated circuit, it is therefore possible to reduce labor time and costs required of the evaluation an compared to the conventional technique of repeating actual measurement with a number of variations of the locations and the values of the capacitances and the resistors of the integrated circuit for the purpose of evaluating the effects of the measures to cope with noise. Accordingly, the reduction of EMI noise can be effectively conducted.

Figure 13:
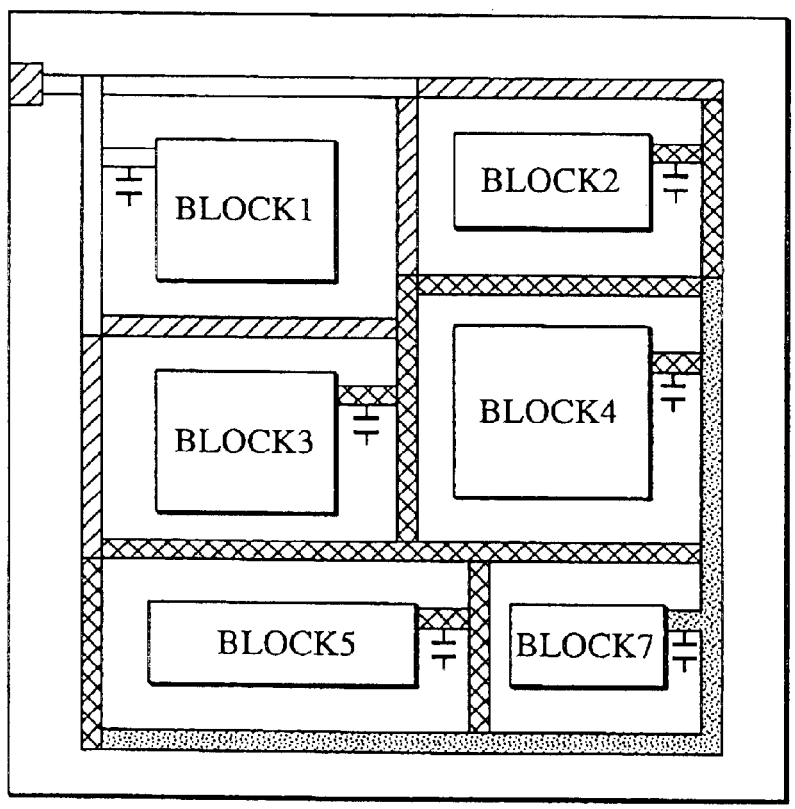
FIG. 13 is an explanatory view for explaining an exemplary display image of the voltage waveform data.

In accordance with the embodiment 1 as explained above, exemplary display images relating to electric currents have been described from the view point of analyzing EMI noise. However, the voltage waveform data can also be obtained by the use of the power supply current/voltage waveform data 27 saved in the noise analyzing apparatus of the embodiment 1 in addition to the current waveform data. For this reason, it is possible to analyze the power voltage 5 drop by overlapping the voltage waveform data over the layout data as illustrated in FIG. 13. FIG. 13 is a schematic diagram showing the voltage of the power line at a time t=10 ns. In this example, a power source line given darker hatching has a lower voltage, i.e., a larger voltage drop.

[Embodiment 2]

Generally speaking, in the case of a linear circuit composed only of RLC and powered by a plurality of the electric power sources, the electric current and the voltage level of any one of the constituent elements of the linear circuit are calculated by gumming up the electric current and the voltage level of the same linear circuit which is assumed to be powered only by each of the plurality of the electric power sources in accordance with the so-called principle of superposition. The power supply netlist is a linear circuit composed only of RLC to that the current/voltage data is obtained on the assumption that one of the plurality of the electric power sources in correspondence with each block exists alone. Accordingly, the current/voltage data in the case that an arbitrary number of electric current sources are connected is obtained by summing up the current/voltage data obtained on the assumption that each of the plurality of the electric current sources exists alone. The embodiment 2 is an applied example of the embodiment 1. The noise analyzing apparatus in accordance with the embodiment 2 is designed in order to obtain the current/voltage data and the spectral data thereof on the assumption that there exists only the electric current source (or sources) as corresponding to the block as designated by a user.

Figure 14:
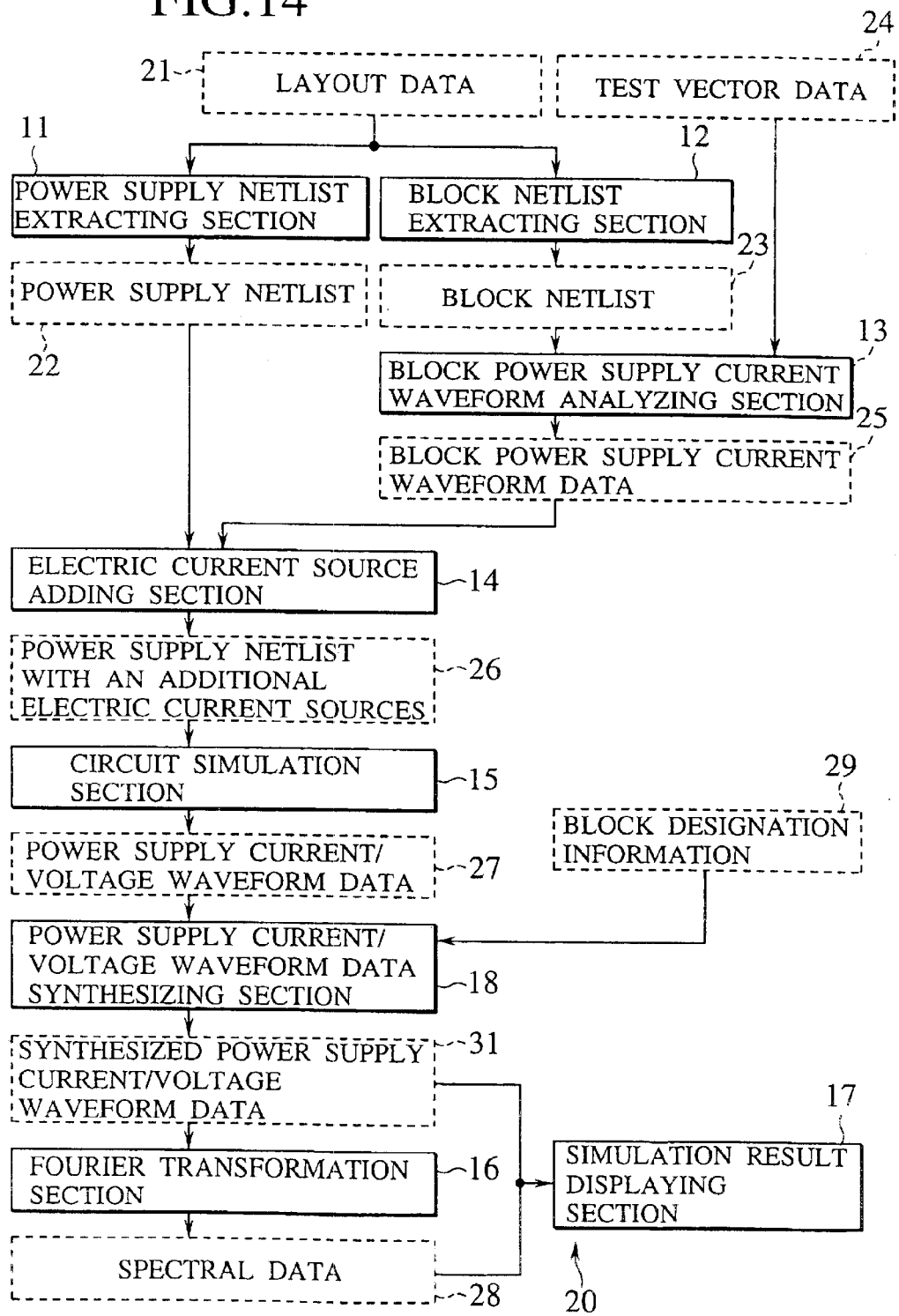
FIG. 14 in a block diagram showing the configuration of the noise analyzing apparatus in accordance with the embodiment 2.

The configuration of the noise analyzing apparatus 20 in accordance with the embodiment 2 is shown in FIG. 14. The noise analyzing apparatus in accordance wits the embodiment 2 consists of the noise analyzing apparatus 10 in accordance with the embodiment 1 to which is added a power supply current/voltage waveform data synthesizing section 18. The other constituent elements have the equivalent structure and function of the counterparts of the previous embodiment as illustrated in FIG. 1 and given the similar references.

The power supply current/voltage waveform data 27 is obtained by the electric current source adding section 14 and the circuit simulation section 15 on the assumption that only one of the electric current sources exists for this purpose, only one electric current source in provided and added by the electric current source adding section 14. The circuit simulation is then performed for the power supply netlist 22 with the additional electric current source as generated with each electric current source added alone.

Figure 15:
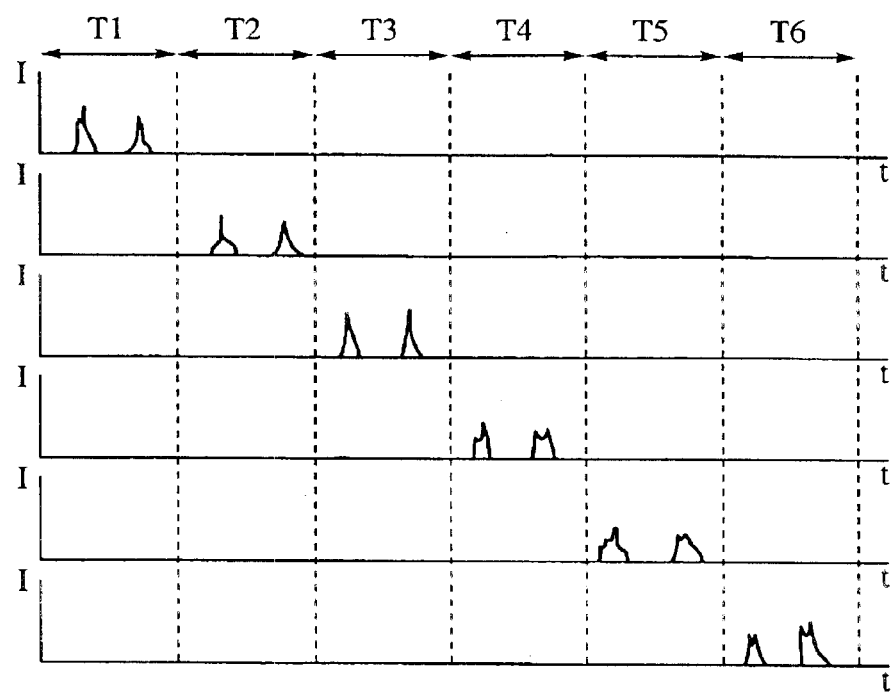
FIG. 15 is a schematic diagram showing the current waveforms to be given to the respective electric current sources by the electric current source adding section.

Alternatively, the current waveforms are given to the respective electric current sources by the electric current source adding section 14. As illustrated in FIG. 15, in each of the time periods T1 to T6, only one electric current source is
n a current waveform while the other electric current sources are given no current waveform. The simulation results of the respective time periods are separately stored in the circuit stimulation section 15. By this configuration, necessary data on the assumption that each of the electric current sources exists alone can be collectively obtained by performing the circuit simulation only at one tire. If a single block is designated in the block designation information, the power supply current/voltage waveform dots synthesizing section 18 generates the power supply current/voltage waveform data 27 calculated on the assumption that there exists only the electric current source an corresponding to the single block as designated. On the other hand, if a plurality of blocks are designated in the block designation information, the power supply current/voltage waveform data synthesizing section 18 generates the synthesized power supply current/voltage waveform data 31 by summing up the power supply current/voltage waveform data calculated on the assumption that there exists only the electric current source alone as corresponding to each block as designated by a user. Accordingly, the power supply current/voltage waveform data synthesizing section 18 serves to generate either of the synthesized power supply current/voltage waveform data 31 and the power supply current/voltage waveforms data 27. In the example as illustrated in FIG. 14 the synthesized power supply current/voltage waveform data 31 is generated. Meanwhile, the block designation information 29 contains the information about the block(s) as designated by a user (the block number(s)). The spectral data 28 is obtained by performing the Fourier transformation of the data by means of the Fourier transformation section 16.

The simulation result displaying section 11 serves to display the synthesized power supply current/voltage waveform data 31 (or the power supply current/voltage waveform data 27) and the spectral data 28. The images to be displayed are prepared in the same manner as explained in the embodiment 1. By this configuration, a user can visually confirmed the current paths and the electric current spectra in the case that there exists only the electric current source (or sources) as corresponding to the block(s) as designated by himself so that it is possible to elaborately provide the measure to reduce noise.

[Embodiment 3]

Figure 16:
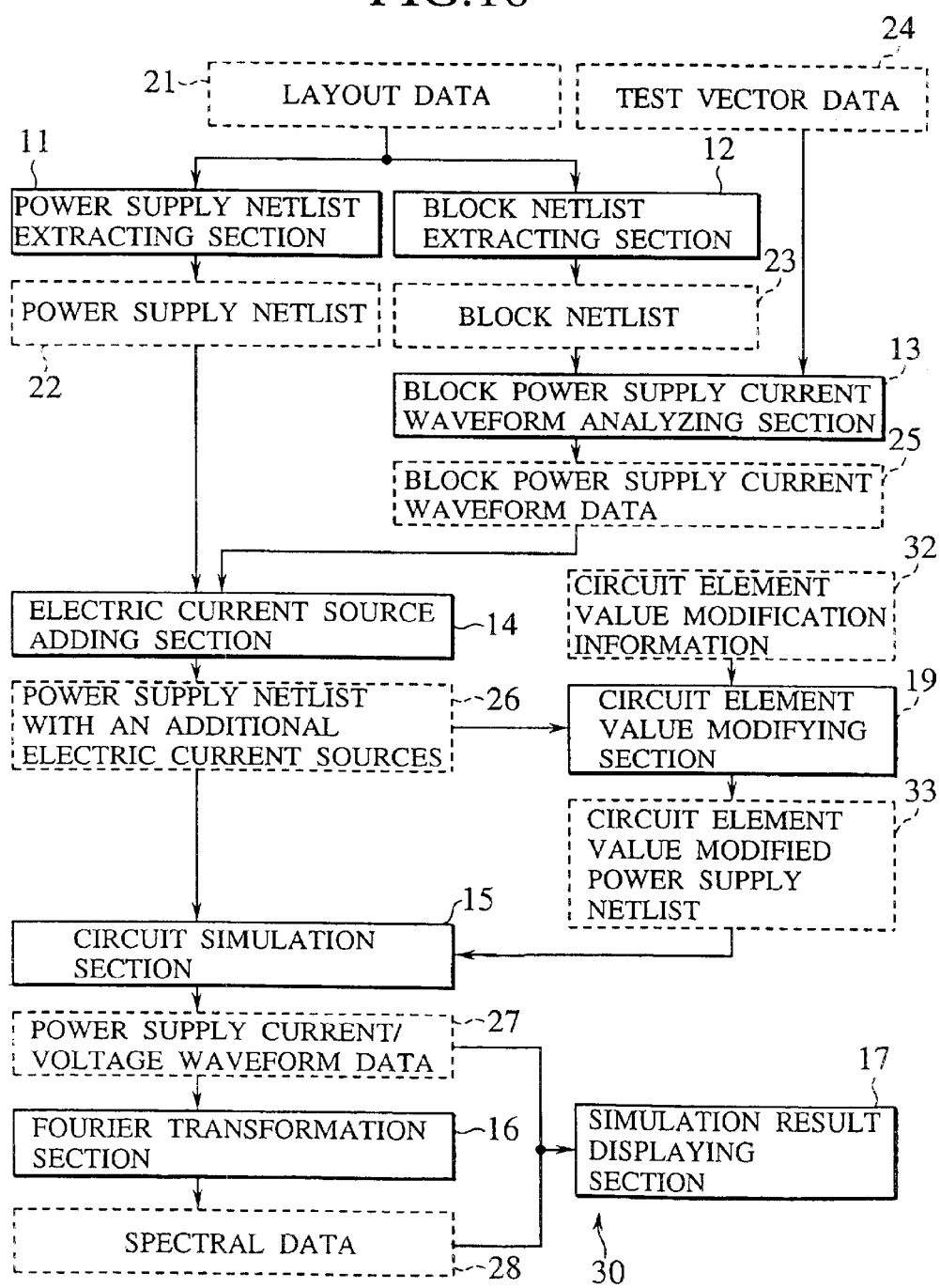
FIG. 16 a block diagram showing the configuration of the noise analyzing apparatus in accordance with the embodiment 3.

The configuration of the noise analyzing apparatus 30 in accordance with the embodiment 3 is shown in FIG. 16. The noise analyzing apparatus in accordance with the embodiment 3 consists of the noise analyzing apparatus 10 in accordance with the embodiment 1 to which is added a circuit element value modifying section 19. The other constituent elements have the equivalent structures and functions of the counterparts of the previous embodiment as illustrated in FIG. 1 and given the similar references.

The circuit element value modifying section 19 serves to generate the circuit element value modified power supply netlist 33 by modifying the characteristic values of the circuit elements contained in the power supply netlist 26 with an additional electric current source(s) on the basis of circuit element value modification information 32. The circuit element value modification information 32 is the information given in order to modify the characteristic values of the circuit elements such as the resistance value, the capacitance value and so forth. The information contains the names of the circuit elements and the characteristic values of the circuit elements before and after the modification. The circuit elements to be modified are designated not only by directly inputting the name of the circuit elements by a user but also by pointing the locations of the respective circuit elements to be designated in the layout data by a user.

Figure 17:
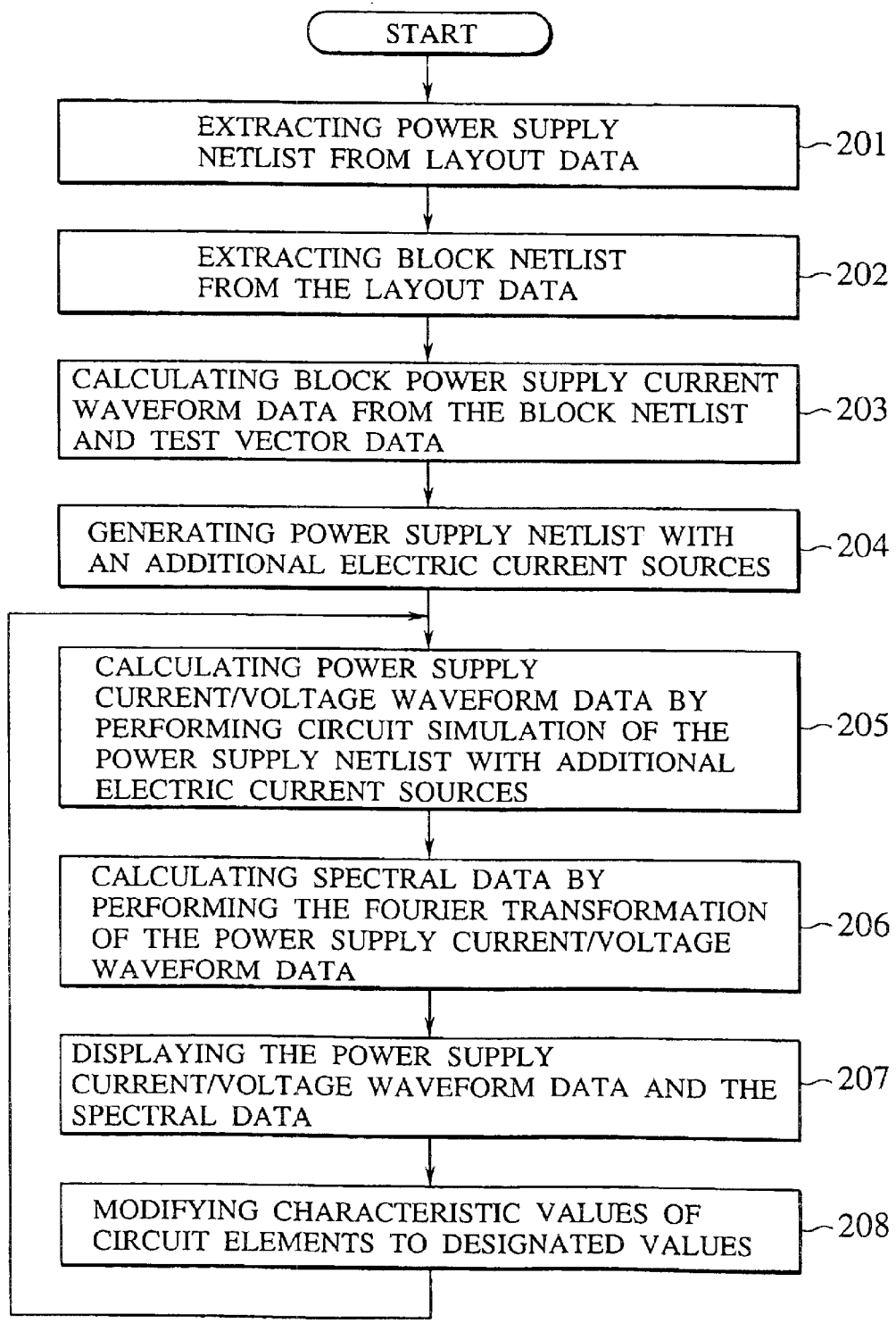
FIG. 17 is a flowchart showing the procedure for the noise analysis by means of the noise analyzing apparatus in accordance with the embodiment 3.

Next, the procedure for the noise analysis by means of the noise analyzing apparatus 30 as described above will be explained in accordance with the flowchart as illustrated in FIG. 17.

The extraction of the power supply netlist (the step 201) to the display of the simulation results (the step 207) are similar as explained above for the steps 101 to 107 as illustrated in FIG. 7.

Following to the stop 207, the characteristic values of the respective circuit elements contained in the power supply netlist with an additional electric current source(s) are modified to characteristic values an designated by the circuit element value modifying section 19 (in step 208) Thereafter, the step 205 is performed again in order to perform the circuit simulation followed by displaying the result by the simulation result displaying section 17. The user can refer to the simulation result after the modification of the characteristic values of the circuit elements. The circuit simulation may be repeated with different characteristic values of the circuit elements as repeatedly modified, if necessary.

By this configuration, a user con easily conduct the analysis with different characteristic values on modified of the circuit elements so that it is possible to effectively evaluate the measures to cope with noise.

[Embodiment 4]

Next, a semiconductor device in accordance with an embodiment of the present invention provided with a noise reduction system.

Figure 18:
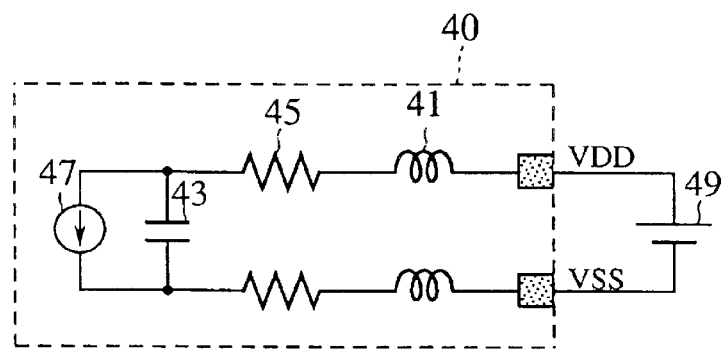
FIG. 18 is a circuit diagram showing an equivalent circuit of a usual integrated circuit.

FIG. 18 is a circuit diagram showing an equivalent circuit of a usual integrated circuit. Generally speaking, an integrated circuit can be represented by ouch an equivalent circuit 40 including an inductor 41, a capacitor 43, a resistor 45, an electric current source 47 and a voltage source 49. The equivalent circuit 40 of this kind can be recognized as an LC parallel resonant circuit 50 that substantial noise is sometimes generated from the electric power source by the resonance in the circuit as explained above.

Figure 19:
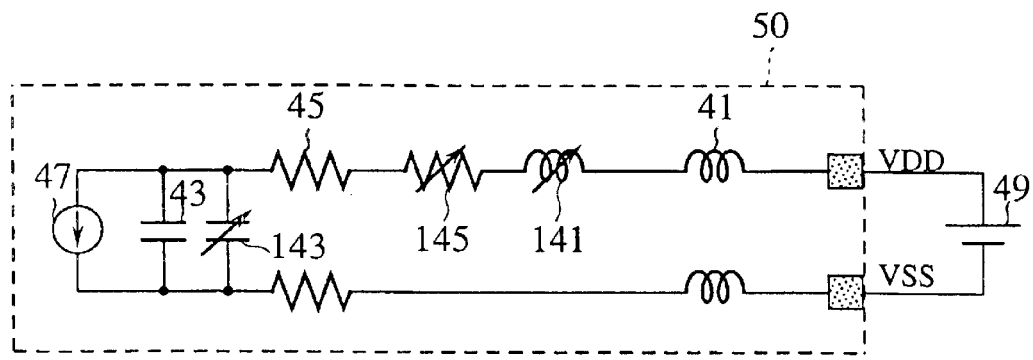
FIG. 19 is a circuit diagram showing the equivalent circuit of an integrated circuit in accordance with the embodiment 4 provided with a noise attenuation mechanism.

FIG. 19 is a circuit diagram showing an equivalent circuit of the integrated circuit in accordance with the embodiment 4. The other constituent elements as illustrated in FIG. 19 have the equivalent structures and functions of the counterparts as illustrated in FIG. 18 and given the similar references. The equivalent circuit 50 as illustrated in FIG. 19 is provided with a variable capacitance element 143 whose capacitance value is variable in parallel with the capacitor 43, a variable inductance element 141 whose inductance value LS variable in series with the inductor 41 and a variable resistance element 145 whose resistance value is variable in series with the resistor 45 respectively as means for modifying electric characteristics. The inductor 141, the variable capacitance element 143 and the variable resistance element 145 as illustrated in FIG. 19 are connected to a control circuit not shown in the figure.

Next, the actual implementation of the variable inductance element 141, the variable capacitance element 143 and the variable resistance element 145 as illustrated in FIG. 19 will be explained.

Figure 20:
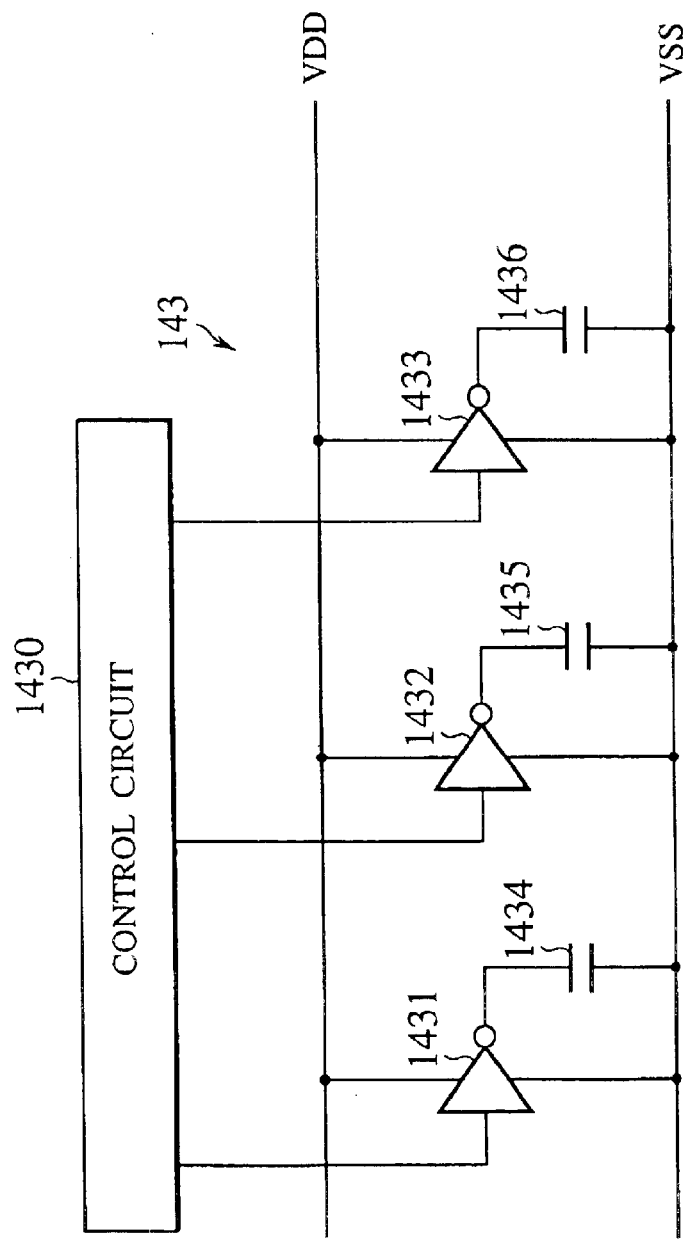
FIG. 20 is a circuit diagram showing a variable capacitance element and a control circuit thereof.

FIG. 20 is a circuit diagram showing the variable capacitance element 143 and a control circuit thereof.

The output terminals of inverter circuits 1431, 1432 and 1433 are connected respectively to capacitors 1434, 1435 and 1436 in FIG. 20. The input terminals of the inverter circuits 1431, 1432 and 1433 are connected respectively to the control circuit 1430. Furthermore, the power terminals of the inverter circuits 141, 1432 and 1433 are connected to VDD (the power potential) while the ground terminals thereof are connected to VSS (the ground potential) respectively. By this configuration, a plurality of capacitance elements are arranged in parallel between VDD and VSS. The operations of the inverter circuits 1431 to 1433. i.e., connection and/or disconnection, are controlled by control signal as given from the control circuit 1430.

In this structure as described above, when an external characteristic value are given to the control circuit 1430, the inverter circuits 1431 to 1433 are selected by the control circuit 1430 in accordance with the eternal characteristic value. The inverter circuit(s) connected to selected capacitor (s) is given a control signal of "0"while the inverter circuit(s) connected to the other capacitor(s) is given a control signal of "1". The inverter circuit(s) given the control signal of "0" serves to form a capacitor(s) between VDD and VSS. The inverter circuit(s) given the control signal of "1" serves to form a capacitor(s) between VSS and VSS. The capacitor(s) between VSS and VSS, however, has no effect. Accordingly, the value of the capacitor in the integrated circuit can be arbitrarily modified by selecting the control signals (0 or 1) output to the inverter circuits respectively in accordance with a desired value. Meanwhile, the capacitances of the capacitors 1434, 1435 and 1436 as illustrated in FIG. 20 may be equal to or different from each other.

Figure 21:
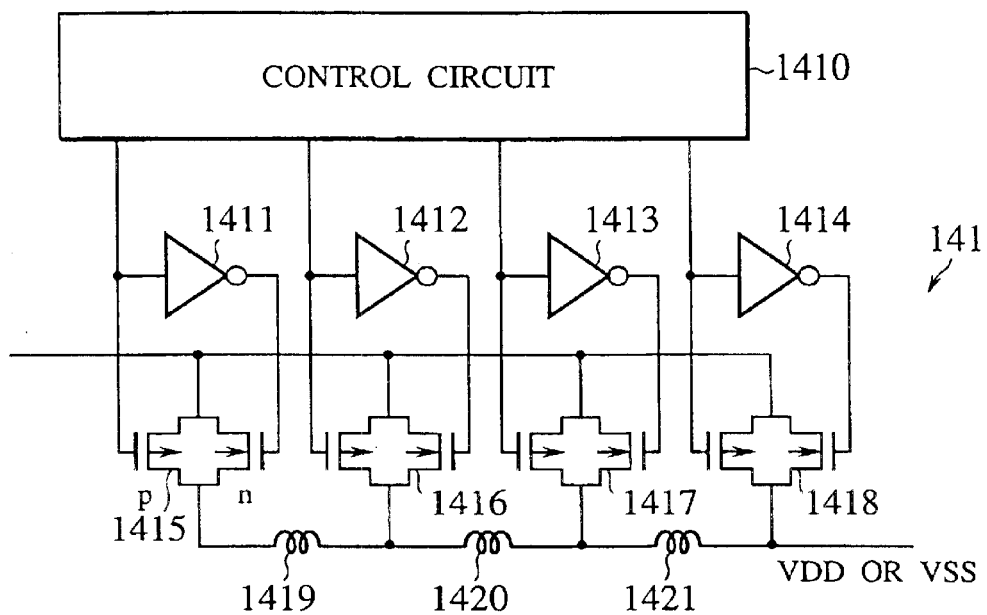
FIG. 21 is a circuit diagram showing the variable inductance element and a control circuit thereof.

FIG. 21 is a circuit diagram showing the variable inductance element 141 and a control circuit thereof.

In FIG. 21, the control signals (0 or 1) output from a control circuit 1410 and the control signals an inverted by inverter circuits 1411, 1412, 1413 and 1414 are given to the p and n terminals of transfer gates 1415, 1416, 1417 and 1410 respectively. The opening/closing operations of the transfer gates 1415 to 1418 are controlled by the control signals output from the control circuit 1410 and the control signals as inverted by the inverter circuits 1411 to 1414. Also, the transfer gates 1415 to 1418 serve to connect a power source line connected with no inductor and a power source line connected with inductors 1419, 1420 and 1421. The power source line as described above is supplied with VDD or VSS.

In this structure as described above, when an external characteristic value are given to the control circuit 1410, the transfer gates 1415 to 1418 are opened/closed in accordance with the external characteristic value by the control circuit 1410. The opening/closing operations of the transfer gates are performed so that some transfer gate is opened while the other transfer gates are closed. By this configuration, the inductor(s) located in the right side or the transfer gate as closed becomes effective on the power source line. For example, if the transfer gate 1417 is closed while the other transfer gates are opened, the inductor 1421 becomes effective. Also, if the transfer gate 1416 is closed while the other transfer gates are opened, the inductor 1420 and the inductor 1421 become effective. Accordingly, the value of the inductance in the integrated circuit can be arbitrarily modified by selecting the control signal (0 or 1) output to the respective transfer gates in accordance with a desired value. Meanwhile, the inductances of the inverter circuits 1419 to 1421 as illustrated in FIG. 21 may be equal to or different from each other.

The resonance frequency can therefore be adjusted by controlling the capacitance of the variable capacitance element 143 and the inductance of the variable inductance element 141 as described above. Accordingly, the resonance am the cause of noise originating from the electric power source can be minimized by controlling the capacitance of the variable capacitance element 143 and the inductance of the variable inductance element 141.

As already explained above, in the case of the conventional technique in which a serial resonant circuit of RLC is added to an integrated circuit, actual measurement has to be repeated with a number of variations of the characteristic values of RLC in order to determine the respective value of R, L and C to be inserted. However, in the case of the equivalent circuit so in accordance with the embodiment 4, the reduction of noise originating from resonant circuits can be effectively conducted. It is therefore possible to reduce labor time and costs required of the procedure.

Figure 22:
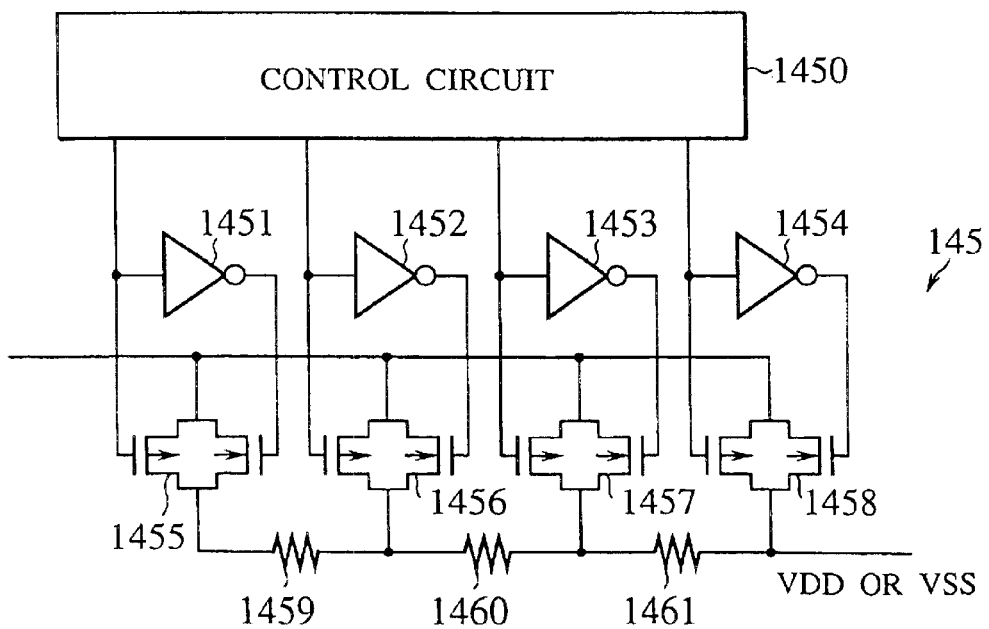
FIG. 22 is a circuit diagram showing the variable resistance element and a control circuit thereof.

FIG. 22 is a circuit diagram showing the variable capacitance element 141 and the control circuit thereof.

In FIG. 22, the control signals output from a control circuit 1450 and the control signals as inverted by inverter circuits 1451, 1452, 1453 and 1454 are given to the p and n terminals of transfer gates 1455, 145, 1457 and 1450 respectively. The opening/closing operations of the transfer gates 1455 to 1458 are controlled by the control signals output from the control circuit 1450 and the control signals as inverted by the inverter circuits 1451 to 1454. Also, the transfer gates 1455 to 1458 serve to connect a power source line connected with no resistor and a power source line connected with resistors 1459, 1460 and 1461. Th power source line as described above is supplied with VDD or VSS.

In this structure am described above, when an external characteristic value are given to the control circuit 1450, the transfer gates 1455 to 1450 are opened/closed in accordance with the external characteristic value by the control circuit 1450. The opening/closing operations of the transfer gates are performed so that some transfer gate is opened while the other transfer gates are closed. By this configuration, the resistor(s) located in the right side of the transfer gate as closed becomes effective on the power source line. For example, if the transfer gate 1457 is closed while the other transfer gates are opened, the resistor 1461 becomes effective. Also, if the transfer gate 1456 is closed while the other transfer gates are opened, the resistor 1460 and the resistor 1461 become effective. Accordingly, this value of the resistance in the integrated circuit can be arbitrarily modified by selecting the control signal (0 or 1) output to the respective transfer gates in accordance with a desired value. Meanwhile, the resistance of the inverter circuits 1459 to 1461 as illustrated in FIG. 22 may be equal to or different from each other.

By means of the variable resistance element 44, the Q of the resonance can be modified by controlling the resistance value. Accordingly, the Q of the resonance can be reduced in the equivalent circuit 50 to the extent that the voltage drop of the electric power source is not problematic.

As already explained above, in the case of the conventional technique, actual measurement has to be repeated with a number of different resistance values in order to determine the optimal resistance value. However, in the case of the equivalent circuit 50 in accordance with the embodiment 4, the reduction of noise originating from resonant circuits can be effectively conducted. Also, it is possible to reduce labor time and coots required of the procedure.

In accordance with the equivalent circuit 50 as illustrated in FIG. 19, the resonance frequency can be adjusted by controlling the capacitance of the variable capacitance element 143 and the inductance of the variable inductance element 141 as described above. On the other hand, by means of the variable resistance element 145, the Q of the resonance con be modified by controlling the resistance value. Accordingly, the reduction of noise originating from resonant circuits can be effectively conducted by controlling adjustment of the respective value of the capacitance, the inductance and the resistance in combination. By this configuration, massproduction of integrated circuits becomes possible after selecting optimum characteristic values corresponding to minimum noise originating from the electric power source. Furthermore, even after massproduction, it is possible to attenuate undesirable noise originating from the electric power source by the adjustment of the characteristic values for an individual integrated circuit.

The variable capacitance element 143, the variable inductance element 141 and the variable resistance element 145 are introduced in the embodiment 4. And separately explained are the example in which the value of the capacitor and the value of the inductor are controlled and the example in which the value of the resistor is controlled. The equivalent circuit is preferably provided with all these elements. i.e. the variable inductance element 141, the variable capacitance element 143 and the variable resistance element 145 in order to effectively conduct the measures to cope with noise originating from the electric power source. However, it is not inevitable to provide all these elements. For example, any combination such as the variable inductance element 141 and the variable capacitance element 143, the variable capacitance element 143 and the variable resistance element 145, and the variable inductance element 141 and the variable resistance element 145 may be effective depending upon the case. Of course, any one of the variable inductance element 141, the variable capacitance element 143 and the variable resistance element 145 can be used alone for the same purpose. Also in this case, the reduction of noise originating from the electric power source can be effectively conducted as compared to the prior art techniques.

Figure 23:
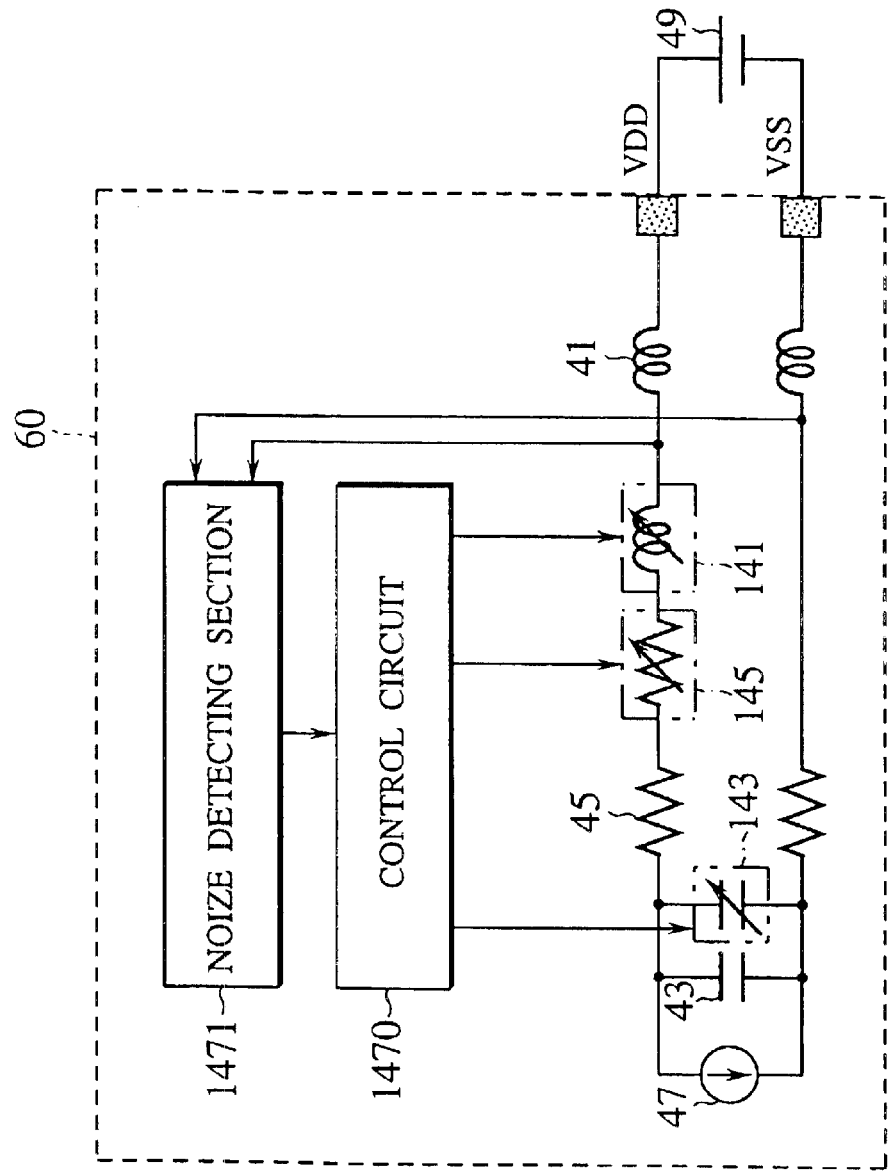
FIG. 23 is a circuit diagram showing the equivalent circuit to which is added the noise detecting mechanism.

FIG. 23 is a circuit diagram showing the equivalent circuit 50 as illustrated in FIG. 19 to which is added a mechanism for automatically reducing noise. The other constituent elements as illustrated in FIG. 23 have the equivalent structures and functions of the counterparts as illustrated in FIG. 19 and given the similar references.

The equivalent circuit 60 as illustrated in FIG. 23 is connected to a noise detecting section 1461 as means for detecting noise. The noise detecting section 1461 serves to detect the signals of VDD and VSS from the power source line. The noise levels of the signals as detected are used for controlling the control circuit 1460. The control circuit 1460 is schematically shown to represent the control circuits 1430, 1410 and 1450 as illustrated in FIGS. 20 to 22. Namely, the control circuit 1460 serves to control the variable capacitance element 143, the variable inductance element 141 and the variable resistance element 145.

In this structure as described above, the signals of VDD and VSS from the power source line is monitored by the noise detecting section 1461 associated with the operation of the integrated circuit. The noise detecting section 1461 serves to calculate the value of the capacitor, the value of the inductor and the value of the resistor by the use of the signals as detected. The values as calculated are output to the control circuit 1460. The control circuit 1460 serves to select the inductors 1419, 1420 and 1421, the capacitors 1434, 1435 and 1436, and the resistors 1459, 1460 and 1461. The control signals (0 or 1) are then given to the variable inductance element 141, the variable capacitance element 143 and the variable resistance element 145 in order to render the capacitors, the inductors) and the resistors) to be selectively effective on the power source line.

By this configuration, it is therefore possible to determine the characteristic values of the respective elements required for reducing noise and input the characteristic values as determined to the control circuit 1460 in consecutive steps as an automatic operation. It is therefore possible to furthermore reduce labor time and costs required of the procedure.

Meanwhile, in the embodiment as illustrated in FIG. 3, the variable capacitance element 143, the variable inductance element 141 and the variable resistance element 145 are introduced. However, it is not inevitable to provide all these elements. Any one of the variable inductance element 141, the variable capacitance element 143 and the variable resistance element 145 can be used alone in order to effectively reduce noise originating from the electric power source as compared to the prior art techniques.

What is claimed is:

1. A method for analyzing EMI noise comprising:

a step of extracting a power supply netlist of a circuit under analysis from a layout data;

a step of calculating the power supply current waveforms of respective blocks of said circuit by the use of a block netlist and test vector data, the power supply current waveforms expressed at least in the time domain;

a step of generating a power supply current with an additional electric current source(s) by giving electric currant sources having the power supply current waveforms of said respective blocks to said power supply netlist;

a step of calculating a power supply current/voltage waveform data, the power supply current/voltage waveform data expressed at least in the time domain, by performing a circuit simulation of said power supply netlist with an additional electric current source(s); and a step of calculating current voltage spectral data by performing the Fourier transformation of the power supply current/voltage waveform data as calculated in the step of performing said circuit simulation;

a step of displaying the current/voltage spectral data as obtained in the step of performing the Fourier transformation.

2. The method for analyzing EMI noise as claimed in claim 1 further comprising:

a step of outputting power supply current/voltage waveform data, if a single block is designated in block designation information, by calculating power supply current/voltage waveform data in the case that there exists only the electric current source as corresponding to the single block as designated, and calculating synthesized power supply current/voltage waveform data, if a plurality of blocks are designated in the block designation information, by summing up the power supply current/voltage waveform data calculated on the assumption that there exists only the electric current source alone as corresponding to each block as designated, wherein, for each of the plurality of the blocks as designated, a single electric current source having a power supply current waveform for said each of the plurality of the blocks as designated is added to said power supply netlist in order to generate said power supply netlist with an additional electric current source (s) in the step of generating said power supply netlist with an additional electric current source(s);

wherein, for each of the plurality of the blocks as designated, power supply current/voltage waveform data in the case that a single electric current, source having a power supply current waveform for said each of the plurality of the blocks as designated exists alone is calculated in the step of performing the circuit simulation by performing circuit simulation of said power supply netlist with additional electric current sources as generated in the step of power supply netlist with an additional electric current source(s); and wherein the current/voltage spectral data is calculated in the step of performing the Fourier transformation by performing the Fourier transformation of the power supply current/voltage waveform data as calculated in the stop of calculating synthesized power supply current/voltage waveform data or by performing the Fourier transformation of the synthesized power supply current voltage waveform data as calculated in the step of calculating synthesized power supply current/voltage waveform data.

3. The method for analyzing EMI noise as claimed in claim 1 further comprising:

a step of generating a circuit element value modified power supply netlist by modifying the characteristic values of circuit elements contained in said power supply netlist with an additional electric current source (s) in accordance with circuit element value modification information as designated in advance.

4. A device for analyzing EMI noise comprising:

a power supply netlist extracting circuit for extracting a power supply netlist of a circuit under analysis from a layout data;

a block power supply circuit waveform analyzing circuit for calculating the power supply current waveforms of each of the respective blocks of said circuit from a block netlist and test vector data, the power supply current waveforms expressed at least in the time domain;

an electric current source adding circuit for generating a power supply netlist with an additional electric current source(s) by adding an electric current source having a power supply current waveform for each of said respective blocks to the power supply netlist as extracted by said power supply netlist extracting circuit;

a circuit simulation circuit for calculating power supply current/voltage waveform data, the power supply current/voltage waveform data expressed at least in the time domain, by performing the circuit simulation of said power supply netlist with an additional electric current source(s);

a Fourier transformation circuit for calculating current/voltage spectral data by performing the Fourier transformation of the power supply current/voltage waveform data as calculated by said circuit simulation circuit; and a display system for displaying the current/voltage spectral data as calculated by said Fourier transformation circuit.

5. The device for analyzing EMI noise as claimed in claim 4 further comprising:

a power supply current/voltage waveform data synthesizing circuit for outputting power supply current/voltage waveform data, if a single block is designated in block designation information, by calculating power supply current/voltage waveform data in the case that there exists only the electric current source as corresponding to the single block as designated, and calculating synthesized power supply current/voltage waveform data, if a plurality of blocks are designated in the block designation information, by summing up the power supply current/voltage waveform data calculated on the assumption that there exists only the electric current source alone as corresponding to each block as designated, wherein, for each of the plurality of the blocks as designated, a single electric current source having a power supply current waveform for said each of the plurality of the blocks as designated is added to said power supply netlist in order to generate said power supply netlist with an additional electric current source(s) by said power supply current/voltage waveform data synthesizing circuit; wherein, for each of the plurality of the blocks as designated, said circuit simulation circuit calculates power supply current/voltage waveform data in the case that a single electric current source having a power supply current waveform for said each of the plurality of the blocks as designated exists alone by performing circuit simulation of said power supply netlist with additional electric current sources as generated by said electric current source adding circuit; and wherein said Fourier transformation circuit calculates the current/voltage spectral data by performing the Fourier transformation of the power supply current/voltage waveform data as calculated by said power supply current/voltage waveform data synthesizing circuit.

6. The device for analyzing EMI noise as claimed in claim 4 wherein said electric current source adding circuit serves to add as the electronic current source for the respective blocks current waveforms defined in a plurality of time periods each of which is given only the current waveform of each one of the respective blocks.

7. The device for analyzing EMI noise as claimed in claim 4 further comprising:

a circuit element value modifying circuit for generating a circuit element value modified power supply netlist by modifying the characteristic values of circuit elements contained in said power supply netlist with an additional electric current source(s) in accordance with circuit element value modification information as designated in advance.

8. The device for analyzing EMI noise as claimed in claim 4 wherein said blocks are defined by dividing the layout data with a grating to form predetermined unit areas.

9. The device for analyzing EMI noise as claimed in claim 4 wherein said block power supply current waveform analyzing circuit comprises a logic simulation circuit for performing a logic simulation of the respective blocks, and a power supply current waveform synthesis circuit that sums up the power supply current waveforms of cells, each cell being defined in the circuit, in accordance with the result of the said logic simulation.

10. The device for analyzing EMI noise as claimed in claim 4 wherein said display system serves to distinctly display the spectral intensity of the current/voltage spectral data on the layout data by colors, patterns and/or combinations thereof at the frequency as designated.

11. The device for analyzing EMI noise as claimed in claim 4 wherein said display system serves to distinctively display the directions of the electric currents with arrows on the layout data at a time as designated in advance, and to distinctively display the level of the electric current by the colors, lengths and/or widths of the arrows at the time as designated.

12. The device for analyzing EMI noise as claimed in claim 4 wherein said display system serves to display the current/voltage waveform data and the current/voltage spectral data in a location as designated in a graphic image.

13. The device for analyzing EMI noise as claimed in claim 4 wherein said display system serves to distinctively display an area including parallel lines through which electric currents flow in the same direction.

14. The device for analyzing EMI noise as claimed in claim 4 wherein said display system serves to distinctively display an area including a loop along which electric currents flow with the product of the area of the lop and the current flowing along the loop which product is than a value as designated in advance.

15. A semiconductor device provided with an inner circuit, which can be replaced by an equivalent parallel resonant circuit comprising:

an electric characteristic value variable circuit provided with said inner circuit whose electric characteristic value can be modified for reduction of EMI noise;

a control circuit for said electronic characteristic value variable circuit in accordance with a predetermined setting value as externally input in order to modify the electric characteristic value of aid inner circuit;

a noise detecting circuit for detecting noise as generated by said inner circuit, said control circuit serves to control said electric characteristic value variable circuit whose electric characteristic value can be modified on the basis of information about the noise as detected by said noise detecting circuit.

16. The semiconductor as claimed in claim 15 wherein said electric characteristic value variable circuit includes at least one as selected among from a group comprising a variable capacitance element whose capacitance value is variable, an variable inductance element whose inductance value is variable and a variable resistance element whose resistance value is variable.

17. The semiconductor as claimed in claim 15 wherein said variable capacitance element is composed of a plurality of capacitors which are rendered effective selectively independent from each other.

18. The semiconductor as claimed in claim 15 wherein said variable inductance element is composed of a plurality of inductors which are rendered effective selectively independent from each other.

19. The semiconductor as claimed in claim 15 wherein said variable resistance element is composed of a plurality of resistors which are rendered effective selectively independent from each other.

* * * * *